(12) United States Patent
Fleming et al.

(10) Patent No.: US 9,082,622 B2
(45) Date of Patent: Jul. 14, 2015

(54) CIRCUIT ELEMENTS COMPRISING FERROIC MATERIALS

(75) Inventors: Robert Fleming, San Jose, CA (US);
Bhret Graydon, San Jose, CA (US);
Daniel Vasquez, San Jose, CA (US);
Junjun Wu, San Jose, CA (US); Farhad Razavi, San Jose, CA (US)

(73) Assignee: LITTELFUSE, INC., Chicago, IL (US)

( * ) Notice: Subject to any disclaimer, the term of this patent is extended or adjusted under 35 U.S.C. 154(b) by 471 days.

(21) Appl. No.: 13/115,068

(22) Filed: May 24, 2011

(65) Prior Publication Data

US 2011/0317318 A1   Dec. 29, 2011

Related U.S. Application Data

(63) Continuation-in-part of application No. 13/096,860, filed on Apr. 28, 2011, and a continuation-in-part of application No. 13/035,791, filed on Feb. 25, 2011.

(60) Provisional application No. 61/347,540, filed on May 24, 2010, provisional application No. 61/328,965, filed on Apr. 28, 2010, provisional application No. 61/308,825, filed on Feb. 26, 2010.

(51) Int. Cl.
*H05K 1/18* (2006.01)
*H01L 27/02* (2006.01)

(52) U.S. Cl.
CPC .................................. *H01L 27/0288* (2013.01)

(58) Field of Classification Search
CPC .................................................... H01L 27/0288
USPC ......... 174/250–268; 361/56, 191.1, 111, 127, 361/760, 763
See application file for complete search history.

(56) References Cited

U.S. PATENT DOCUMENTS

| 3,347,724 A | 10/1967 | Schneble, Jr. et al. |
| 3,685,026 A | 8/1972 | Wakabayashi et al. |

(Continued)

FOREIGN PATENT DOCUMENTS

| CH | 663491 A5 | 12/1987 |
| DE | 3040784 | 5/1982 |

(Continued)

OTHER PUBLICATIONS

Breton et al., "Mechanical properties of multiwall carbon nanotubes/epoxy composites: influence of network morphology," Carbon Elsevier UK, vol. 42, No. 5-6, pp. 1027-1030 (2004).

(Continued)

*Primary Examiner* — Yuriy Semenenko
(74) *Attorney, Agent, or Firm* — Kacvinsky Daisak Bluni PLLC

(57) ABSTRACT

Ferroic circuit elements that include a set of conductive structures that are at least partially embedded within a ferroic medium are disclosed. The ferroic medium may be a voltage switched dielectric material that includes ferroic particles in accordance with various embodiments. A ferroic circuit element may be at least partially embedded within a substrate in accordance with embodiments of the current invention as an embedded ferroic circuit element. An embedded ferroic circuit element that is an inductor in accordance with embodiments of the current invention may be denoted as an embedded ferroic inductor. An embedded ferroic circuit element that is a capacitor in accordance with embodiments of the current invention may be denoted as an embedded ferroic capacitor.

16 Claims, 12 Drawing Sheets

(56) References Cited

U.S. PATENT DOCUMENTS

| | | |
|---|---|---|
| 3,685,028 A | 8/1972 | Wakabayashi et al. |
| 3,723,635 A | 3/1973 | Smith |
| 3,808,576 A | 4/1974 | Castonguay et al. |
| 3,926,916 A | 12/1975 | Mastrangelo |
| 3,977,957 A | 8/1976 | Kosowsky et al. |
| 4,113,899 A | 9/1978 | Henry et al. |
| 4,133,735 A | 1/1979 | Afromowitz et al. |
| 4,252,692 A | 2/1981 | Taylor et al. |
| 4,269,672 A | 5/1981 | Inoue |
| 4,331,948 A | 5/1982 | Malinaric et al. |
| 4,359,414 A | 11/1982 | Mastrangelo |
| 4,405,432 A | 9/1983 | Kosowsky |
| 4,439,809 A | 3/1984 | Weight et al. |
| 4,506,285 A | 3/1985 | Einzinger |
| 4,591,411 A | 5/1986 | Reimann |
| 4,642,160 A | 2/1987 | Burgess |
| 4,702,860 A | 10/1987 | Kinderov et al. |
| 4,714,952 A | 12/1987 | Takekawa et al. |
| 4,726,877 A | 2/1988 | Fryd et al. |
| 4,726,991 A | 2/1988 | Hyatt et al. |
| 4,799,128 A | 1/1989 | Chen |
| 4,888,574 A | 12/1989 | Rice et al. |
| 4,892,776 A | 1/1990 | Rice |
| 4,918,033 A | 4/1990 | Bartha et al. |
| 4,928,199 A | 5/1990 | Diaz et al. |
| 4,935,584 A | 6/1990 | Boggs |
| 4,977,357 A | 12/1990 | Shrier |
| 4,992,333 A | 2/1991 | Hyatt |
| 4,996,945 A | 3/1991 | Dix, Jr. |
| 5,068,634 A | 11/1991 | Shrier |
| 5,092,032 A | 3/1992 | Murakami |
| 5,095,626 A | 3/1992 | Kitamura et al. |
| 5,099,380 A | 3/1992 | Childers et al. |
| 5,142,263 A | 8/1992 | Childers et al. |
| 5,148,355 A | 9/1992 | Lowe et al. |
| 5,167,778 A | 12/1992 | Kaneko et al. |
| 5,183,698 A | 2/1993 | Stephenson et al. |
| 5,189,387 A | 2/1993 | Childers et al. |
| 5,246,388 A | 9/1993 | Collins et al. |
| 5,248,517 A | 9/1993 | Shrier et al. |
| 5,252,195 A | 10/1993 | Kobayashi et al. |
| 5,260,848 A | 11/1993 | Childers |
| 5,262,754 A | 11/1993 | Collins |
| 5,278,535 A | 1/1994 | Xu et al. |
| 5,282,312 A | 2/1994 | DiStefano et al. |
| 5,294,374 A | 3/1994 | Martinez et al. |
| 5,295,297 A | 3/1994 | Kitamura et al. |
| 5,300,208 A | 4/1994 | Angelopoulos et al. |
| 5,317,801 A | 6/1994 | Tanaka et al. |
| 5,340,641 A | 8/1994 | Xu |
| 5,347,258 A | 9/1994 | Howard et al. |
| 5,354,712 A | 10/1994 | Ho et al. |
| 5,367,764 A | 11/1994 | DiStefano et al. |
| 5,378,858 A | 1/1995 | Bruckner et al. |
| 5,380,679 A | 1/1995 | Kano |
| 5,393,597 A | 2/1995 | Childers et al. |
| 5,403,208 A | 4/1995 | Felcman et al. |
| 5,404,637 A | 4/1995 | Kawakami |
| 5,413,694 A | 5/1995 | Dixon et al. |
| 5,416,662 A | 5/1995 | Kurasawa et al. |
| 5,440,075 A | 8/1995 | Kawakita et al. |
| 5,444,593 A | 8/1995 | Allina |
| 5,476,471 A | 12/1995 | Shifrin et al. |
| 5,481,795 A | 1/1996 | Hatakeyama et al. |
| 5,483,407 A | 1/1996 | Anastasio et al. |
| 5,487,218 A | 1/1996 | Bhatt et al. |
| 5,493,146 A | 2/1996 | Pramanik et al. |
| 5,501,350 A | 3/1996 | Yoshida et al. |
| 5,502,889 A | 4/1996 | Casson et al. |
| 5,510,629 A | 4/1996 | Karpovich et al. |
| 5,550,400 A | 8/1996 | Takagi et al. |
| 5,557,136 A | 9/1996 | Gordon et al. |
| 5,654,564 A | 8/1997 | Mohsen |
| 5,669,381 A | 9/1997 | Hyatt |
| 5,685,070 A | 11/1997 | Alpaugh et al. |
| 5,708,298 A | 1/1998 | Masayuki et al. |
| 5,714,794 A | 2/1998 | Tsuyama et al. |
| 5,734,188 A | 3/1998 | Murata et al. |
| 5,744,759 A | 4/1998 | Ameen et al. |
| 5,781,395 A | 7/1998 | Hyatt |
| 5,802,714 A | 9/1998 | Kobayashi et al. |
| 5,807,509 A | 9/1998 | Shrier et al. |
| 5,808,351 A | 9/1998 | Nathan et al. |
| 5,834,160 A | 11/1998 | Ferry et al. |
| 5,834,824 A | 11/1998 | Shepherd et al. |
| 5,834,893 A | 11/1998 | Bulovic et al. |
| 5,848,467 A | 12/1998 | Khandros et al. |
| 5,856,910 A | 1/1999 | Yurchenco et al. |
| 5,865,934 A | 2/1999 | Yamamoto et al. |
| 5,869,869 A | 2/1999 | Hively |
| 5,874,902 A | 2/1999 | Heinrich et al. |
| 5,906,042 A | 5/1999 | Lan et al. |
| 5,910,685 A | 6/1999 | Watanabe et al. |
| 5,926,951 A | 7/1999 | Khandros et al. |
| 5,940,683 A | 8/1999 | Holm et al. |
| 5,946,555 A | 8/1999 | Crumly et al. |
| 5,955,762 A | 9/1999 | Hively |
| 5,956,612 A | 9/1999 | Elliott et al. |
| 5,962,815 A | 10/1999 | Lan et al. |
| 5,970,321 A | 10/1999 | Hively |
| 5,972,192 A | 10/1999 | Dubin et al. |
| 5,977,489 A | 11/1999 | Crotzer et al. |
| 6,013,358 A | 1/2000 | Winnett et al. |
| 6,023,028 A | 2/2000 | Neuhalfen |
| 6,064,094 A | 5/2000 | Intrater et al. |
| 6,108,184 A | 8/2000 | Minervini et al. |
| 6,114,672 A | 9/2000 | Iwasaki et al. |
| 6,130,459 A | 10/2000 | Intrater |
| 6,160,695 A | 12/2000 | Winnett et al. |
| 6,172,590 B1 | 1/2001 | Shrier et al. |
| 6,184,280 B1 | 2/2001 | Shibuta |
| 6,191,928 B1 | 2/2001 | Rector et al. |
| 6,198,392 B1 | 3/2001 | Hahn et al. |
| 6,211,554 B1 | 4/2001 | Whitney |
| 6,239,687 B1 * | 5/2001 | Shrier et al. ............... 338/21 |
| 6,251,513 B1 | 6/2001 | Rector et al. |
| 6,310,752 B1 | 10/2001 | Shrier et al. |
| 6,316,734 B1 | 11/2001 | Yang |
| 6,340,789 B1 | 1/2002 | Petritsch et al. |
| 6,351,011 B1 | 2/2002 | Whitney et al. |
| 6,373,719 B1 | 4/2002 | Behling et al. |
| 6,407,411 B1 | 6/2002 | Wojnarowski et al. |
| 6,433,394 B1 | 8/2002 | Intrater |
| 6,448,900 B1 | 9/2002 | Chen |
| 6,455,916 B1 | 9/2002 | Robinson |
| 6,468,593 B1 | 10/2002 | Iizawa et al. |
| 6,512,458 B1 | 1/2003 | Kobayashi et al. |
| 6,534,422 B1 | 3/2003 | Ichikawa et al. |
| 6,542,065 B2 | 4/2003 | Shrier et al. |
| 6,549,114 B2 | 4/2003 | Whitney et al. |
| 6,570,765 B2 | 5/2003 | Behling et al. |
| 6,593,597 B2 | 7/2003 | Sheu |
| 6,621,172 B2 | 9/2003 | Nakayama et al. |
| 6,628,498 B2 | 9/2003 | Whitney et al. |
| 6,642,297 B1 | 11/2003 | Hyatt et al. |
| 6,657,532 B1 | 12/2003 | Shrier et al. |
| 6,677,183 B2 | 1/2004 | Sakaguchi et al. |
| 6,693,508 B2 | 2/2004 | Whitney et al. |
| 6,709,944 B1 | 3/2004 | Durocher et al. |
| 6,741,217 B2 | 5/2004 | Toncich et al. |
| 6,797,145 B2 | 9/2004 | Kosowsky |
| 6,882,051 B2 | 4/2005 | Majumdar et al. |
| 6,903,175 B2 | 6/2005 | Gore et al. |
| 6,911,676 B2 | 6/2005 | Yoo |
| 6,916,872 B2 | 7/2005 | Yadav et al. |
| 6,981,319 B2 | 1/2006 | Shrier |
| 7,034,652 B2 | 4/2006 | Whitney et al. |
| 7,049,926 B2 | 5/2006 | Shrier et al. |
| 7,053,468 B2 | 5/2006 | Lee |
| 7,064,353 B2 | 6/2006 | Bhat |
| 7,067,840 B2 | 6/2006 | Klauk et al. |
| 7,132,697 B2 | 11/2006 | Weimer et al. |
| 7,132,922 B2 | 11/2006 | Harris et al. |
| 7,141,184 B2 | 11/2006 | Chacko |

(56) References Cited

U.S. PATENT DOCUMENTS

| | | | |
|---|---|---|---|
| 7,173,288 B2 | 2/2007 | Lee et al. | |
| 7,183,891 B2 | 2/2007 | Harris et al. | |
| 7,202,770 B2 | 4/2007 | Harris et al. | |
| 7,205,613 B2 | 4/2007 | Fjelstad et al. | |
| 7,218,492 B2 | 5/2007 | Shrier | |
| 7,279,724 B2 | 10/2007 | Collins, III et al. | |
| 7,320,762 B2 | 1/2008 | Greuter et al. | |
| 7,341,824 B2 | 3/2008 | Sexton | |
| 7,417,194 B2 | 8/2008 | Shrier | |
| 7,446,030 B2 | 11/2008 | Kosowsky | |
| 7,488,625 B2 | 2/2009 | Knall | |
| 7,492,504 B2 | 2/2009 | Chopra et al. | |
| 7,528,467 B2 | 5/2009 | Lee | |
| 7,535,462 B2 | 5/2009 | Spath et al. | |
| 7,585,434 B2 | 9/2009 | Morita et al. | |
| 7,593,203 B2 * | 9/2009 | Dudnikov et al. | 361/56 |
| 7,609,141 B2 | 10/2009 | Harris et al. | |
| 7,692,270 B2 | 4/2010 | Subramanyam et al. | |
| 7,872,251 B2 | 1/2011 | Kosowsky et al. | |
| 7,923,844 B2 | 4/2011 | Kosowsky | |
| 2002/0004258 A1 | 1/2002 | Nakayama et al. | |
| 2002/0050912 A1 | 5/2002 | Shrier et al. | |
| 2002/0061363 A1 | 5/2002 | Halas et al. | |
| 2003/0010960 A1 | 1/2003 | Greuter et al. | |
| 2003/0025587 A1 * | 2/2003 | Whitney et al. | 338/22 R |
| 2003/0071245 A1 | 4/2003 | Harris, IV | |
| 2003/0079910 A1 | 5/2003 | Kosowsky | |
| 2003/0151029 A1 | 8/2003 | Hsu et al. | |
| 2003/0218851 A1 | 11/2003 | Harris et al. | |
| 2004/0000725 A1 | 1/2004 | Lee | |
| 2004/0062041 A1 | 4/2004 | Cross et al. | |
| 2004/0063839 A1 | 4/2004 | Kawate et al. | |
| 2004/0095658 A1 | 5/2004 | Buretea et al. | |
| 2004/0154828 A1 | 8/2004 | Moller et al. | |
| 2004/0160300 A1 | 8/2004 | Shrier | |
| 2004/0201941 A1 | 10/2004 | Harris et al. | |
| 2004/0211942 A1 | 10/2004 | Clark et al. | |
| 2004/0241894 A1 | 12/2004 | Nagai et al. | |
| 2004/0262583 A1 | 12/2004 | Lee | |
| 2005/0026334 A1 | 2/2005 | Knall | |
| 2005/0039949 A1 | 2/2005 | Kosowsky | |
| 2005/0057867 A1 | 3/2005 | Harris et al. | |
| 2005/0083163 A1 | 4/2005 | Shrier | |
| 2005/0106098 A1 | 5/2005 | Tsang et al. | |
| 2005/0121653 A1 | 6/2005 | Chacko | |
| 2005/0175938 A1 | 8/2005 | Casper et al. | |
| 2005/0184387 A1 | 8/2005 | Collins, III et al. | |
| 2005/0218380 A1 | 10/2005 | Gramespacher et al. | |
| 2005/0255631 A1 | 11/2005 | Bureau et al. | |
| 2005/0274455 A1 | 12/2005 | Extrand | |
| 2005/0274956 A1 | 12/2005 | Bhat | |
| 2005/0275070 A1 | 12/2005 | Hollingsworth | |
| 2006/0060880 A1 | 3/2006 | Lee et al. | |
| 2006/0069199 A1 | 3/2006 | Charati et al. | |
| 2006/0142455 A1 | 6/2006 | Agarwal et al. | |
| 2006/0152334 A1 * | 7/2006 | Maercklein et al. | 338/210 |
| 2006/0166474 A1 | 7/2006 | Vereecken et al. | |
| 2006/0167139 A1 | 7/2006 | Nelson et al. | |
| 2006/0181826 A1 | 8/2006 | Dudnikov et al. | |
| 2006/0181827 A1 | 8/2006 | Dudnikov et al. | |
| 2006/0193093 A1 | 8/2006 | Bertin et al. | |
| 2006/0199390 A1 | 9/2006 | Dudnikov et al. | |
| 2006/0211837 A1 | 9/2006 | Ko et al. | |
| 2006/0214156 A1 | 9/2006 | Pan et al. | |
| 2006/0234127 A1 | 10/2006 | Kim et al. | |
| 2006/0291127 A1 | 12/2006 | Kim et al. | |
| 2007/0114640 A1 | 5/2007 | Kosowsky | |
| 2007/0116976 A1 | 5/2007 | Tan et al. | |
| 2007/0123625 A1 | 5/2007 | Dorade et al. | |
| 2007/0139848 A1 * | 6/2007 | Harris et al. | 361/118 |
| 2007/0146941 A1 | 6/2007 | Harris et al. | |
| 2007/0208243 A1 | 9/2007 | Gabriel et al. | |
| 2007/0241458 A1 | 10/2007 | Ding et al. | |
| 2008/0045770 A1 | 2/2008 | Sigmund et al. | |
| 2008/0047930 A1 | 2/2008 | Blanchet et al. | |
| 2008/0073114 A1 | 3/2008 | Kosowsky et al. | |
| 2008/0144355 A1 | 6/2008 | Boeve et al. | |
| 2008/0278873 A1 * | 11/2008 | Leduc et al. | 361/56 |
| 2009/0044970 A1 | 2/2009 | Kosowsky | |
| 2009/0309074 A1 | 12/2009 | Chen et al. | |
| 2009/0310265 A1 | 12/2009 | Fukuoka et al. | |
| 2010/0038119 A1 | 2/2010 | Kosowsky | |
| 2010/0038121 A1 | 2/2010 | Kosowsky | |
| 2010/0040896 A1 | 2/2010 | Kosowsky | |
| 2010/0044079 A1 | 2/2010 | Kosowsky | |
| 2010/0044080 A1 | 2/2010 | Kosowsky | |
| 2010/0047535 A1 | 2/2010 | Kosowsky et al. | |
| 2010/0187006 A1 | 7/2010 | Kosowsky et al. | |
| 2010/0243302 A1 | 9/2010 | Kosowsky et al. | |
| 2010/0270588 A1 | 10/2010 | Kosowsky et al. | |
| 2011/0061230 A1 | 3/2011 | Kosowsky | |
| 2011/0062388 A1 | 3/2011 | Kosowsky et al. | |

FOREIGN PATENT DOCUMENTS

| | | |
|---|---|---|
| DE | 10115333 A1 | 1/2002 |
| DE | 102004049053 | 5/2005 |
| DE | 102006047377 | 4/2008 |
| EP | 0790758 | 8/1997 |
| EP | 0930623 | 7/1999 |
| EP | 1003229 | 5/2000 |
| EP | 1245586 | 10/2002 |
| EP | 1542240 | 6/2005 |
| EP | 1580809 | 9/2005 |
| EP | 1990834 | 11/2008 |
| JP | 56091464 | 7/1981 |
| JP | 63195275 | 8/1988 |
| JP | 2000062076 | 2/2000 |
| WO | 8906859 | 7/1989 |
| WO | 9602922 | 2/1996 |
| WO | 9602924 | 2/1996 |
| WO | 9726665 | 7/1997 |
| WO | 9823018 | 5/1998 |
| WO | 9924992 | 5/1999 |
| WO | 02103085 | 12/2002 |
| WO | 2005100426 | 10/2005 |
| WO | 2006130366 | 12/2006 |
| WO | 2007062170 | 5/2007 |
| WO | 2007062171 | 5/2007 |
| WO | 2008016858 | 2/2008 |
| WO | 2008016859 | 2/2008 |
| WO | 2008153584 | 12/2008 |

OTHER PUBLICATIONS

Celzard, A., et al., "Conduction Mechanisms in Some Graphite-polymer Composites: The Effect of a Direct-current Electric Field", Journal of Physics: Condensed Matter, 9 (1997) pp. 2225-2237.

Facchetti, Antonio, "Semiconductors for Organic Transistors", Materials Today, vol. 10, No. 3, pp. 28-37.

Fullerene Chemistry—Wikipedia, http://en.wikipedia.org/wiki/Fullerene/chemistry, 6 pages, printed Apr. 8, 2010.

Granstrom et al., "laminated fabrication of polymeric photovoltaic diodes," Nature, vol. 395, pp. 257-260 (1998).

Guo et al., "Block Copolymer Modified Novolac Epoxy Resin," Polymer Physics, vol. 41, No. 17, pp. 1994-2003 (2003).

Levinson et al. "The Physics of Metal Oxide Varistors," J. App. Phys. 46 (3): 1332-1341 (1975).

Modine, F.A. and Hyatt, H.M. "New Varistor Material", Journal of Applied Physics, 64 (8), Oct. 15, 1988, pp. 4229-4232.

Onoda et al., "Photoinduced Charge Transfer of Conducting Polymer Compositions," IEICE Trans. Electronics, vol. E81-C(7), pp. 1051-1056 (1998).

Raffaelle et al., "Nanomaterial Development for Polymeric Solar Cells," IEEE 4th World Conf on Photovoltaic energy Conversion, pp. 186-189 (2006).

Reese, Colin and Bao, Zhenan, "Organic Single-Crystal Field-Effect Transistors", Materials Today, vol. 10, No. 3, pp. 20-27.

Saunders et al., "Nanoparticle-polymer photovoltaic cells," Adv. Colloid Int. Sci., vol. 138, No. 1, pp. 1-23 (2007).

* cited by examiner

Tape Casting    Screen Printing    Lamination

CIRCUIT ELEMENTS COMPRISING FERROIC MATERIALS

CROSS REFERENCE TO RELATED APPLICATIONS

This application claims the priority benefit of U.S. provisional application No. 61/347,540, filed May 24, 2010, and titled "Ferroic Materials;" and is a continuation-in-part and claims the priority benefit of U.S. patent application Ser. No. 13/096,860, filed Apr. 28, 2011, and titled "Embedded Protection Against Spurious Electrical Events," which claims the priority benefit of U.S. provisional application No. 61/328,965, filed Apr. 28, 2010, and titled "Embedded Protection Against Spurious Electrical Events;" and is a continuation-in-part and claims the priority benefit of U.S. patent application Ser. No. 13/035,791, filed Feb. 25, 2011, and titled "Electric Discharge Protection for Surface Mounted and Embedded Components," which claims the priority benefit of U.S. provisional application No. 61/308,825, filed Feb. 26, 2010, and titled "Protecting Embedded Components." The above referenced applications are hereby incorporated by reference in their entirety.

BACKGROUND

1. Technical Field

The present invention relates to ferroic materials, and more particularly to circuit elements comprising ferroic materials.

2. Background

Electronic devices are often fabricated by assembling and connecting various components (e.g., integrated circuits, passive components, chips, and the like, hereinafter "chips"). Many components, particularly semiconductors, are sensitive to spurious electrical events that apply excessive voltage to the devices in what is termed an overvoltage condition. Examples of sources of overvoltage conditions include electrostatic discharge (ESD), back electromotive force (EMF), lightning, solar wind, switched electromagnetic induction loads such as electric motors and electromagnets, switched heavy resistive loads, large current changes, electromagnetic pulses, and the like. Overvoltage conditions may result in a high voltage at a device containing active and/or passive electronic components or circuit elements, such as a semiconductor IC chip, which may cause large current flow through or within the components. The large current flow may effectively destroy or otherwise negatively impact the functionality of such active or passive components or circuit elements.

Some chips include "on-chip" protection against some overvoltage events (e.g., a mild ESD event) that may be expected during packaging of the chip or operation of the respective electronic device (e.g., protection against Human Body Model events).

A chip may be packaged (e.g., attached to a substrate). A packaged chip may be connected to additional (e.g., ex-chip) overvoltage protection devices, that protect the packaged chip against more severe (e.g., higher voltage) overvoltage events. Inasmuch as the on-chip and off-chip overvoltage protection devices are in electrical communication, the off-chip overvoltage protection device may be required to "protect" the on-chip overvoltage protection device. Off-chip overvoltage protection devices using discrete components are difficult to add during manufacture of the substrate. Moreover, on-chip protection is difficult to optimize across a complete system or subsystem. Examples of specifications for ESD testing include IEC 61000-4-2 and JESD22-A114E.

A printed circuit board, printed wiring board, or similar substrate (hereinafter also referred to as PCB) may be used to assemble, support, and connect electronic components. A PCB typically includes a substrate of dielectric material and one or more conductive leads to provide electrical conductivity among various attached components, chips, and the like. Typically, a pattern of metallic leads is plated (e.g., using printing technology such as silk-screening) onto the dielectric substrate to provide electrical connectivity. Alternatively a metallic layer (e.g., a layer of Cu, Ag, Au) is applied to the substrate and subsequently portions of the metallic layer are removed (e.g., etched) resulting in the desired pattern. Multiple layers of conductive patterns and/or dielectric materials may be disposed on a PCB. The layers may be connected using vias. Printed circuit boards including 14 or more layers are not uncommon.

A PCB is typically used for supporting and connecting various integrated electronic components, such as chips, packages, and other integrated devices. The PCB may also support and connect discrete components, such as resistors, capacitors, inductors, and the like, and provide connections between integrated and discrete components. The conductive patterns and/or layers in the PCB and other components or areas within electronic devices sometimes provide paths for conducting overvoltage events that could damage or otherwise negatively impact components.

Discrete components are sometimes manufactured by incorporating certain functional structures inside a supporting medium or package. For example, a discrete inductor component may be manufactured by embedding a conductive coil structure inside a ferroic material medium, which may then be further packaged to produce a discrete packaged ferroic inductor component. The discrete ferroic inductor components known in the prior art may be attached to a PCB board to act as an inductor in an electronic circuit. In general, a discrete component that is constructed by embedding a conductive structure in a ferroic material may be referred to as a "discrete ferroic component." Examples of discrete ferroic components that exist in the prior art include, discrete ferroic inductors and discrete ferroic capacitors. Examples of ferroic materials used in prior art discrete components include ferrites, such as $Fe_2O_3$.

FIG. 1A shows a block diagram of a discrete ferroic inductor 100 in the prior art, as described in a document from Shenzhen Sunlord Electronics Co. (Shenzhen), dated Feb. 10, 2007, available from Shenzhen's website, and also available in the file history of this patent (the "Shenzhen Presentation"), which is incorporated by reference herein in its entirety. The inductor 100 of FIG. 1A, is a conductive structure 102 made out of silver (Ag) which is embedded in a ferroic medium. The discrete ferroic inductor 100 of FIG. 1A acts as a discrete ferrite bead. Discrete ferrite beads have been used in the prior art to act as passive low-pass filters by filtering out higher frequency noise. FIG. 1B shows an X-Ray view of a conductive structure 112 represented by the block diagram conductive structure 102 of the discrete ferroic inductor 100 of FIG. 1A, as illustrated in the Shenzhen Presentation.

FIG. 1C and FIG. 1D illustrate a manufacturing process for a discrete ferroic inductor in accordance with the Shenzhen Presentation. In FIG. 1C, a discrete ferroic inductor is manufactured through tape casting, screen printing and then lamination. In FIG. 1D, a discrete ferroic inductor is processed and eventually packaged into a discrete component that could be utilized in an electrical circuit (e.g., by being surface mounted to a PCB).

FIG. 1E illustrates a plot of a transfer curve for a prior art ferrite bead inductor having a structure such as the inductor 100 illustrated in FIGS. 1A and 1B. The plot of FIG. 1E illustrates an example of the impedance characteristic for two different ferrite bead inductors 100. The impedance characteristics vary depending on the material and structure. The signal waveform and noise suppression effect vary depending on the impedance.

SUMMARY

Various aspects of a ferroic circuit element comprise a ferroic VSD material and a set of conductive structures that are at least partially embedded within the ferroic VSD material. The set of conductive structures and the ferroic VSD material may cause the ferroic circuit element to exhibit a frequency-dependent impedance. In some embodiments, the set of conductive structures comprises at least a portion of a coil, and the ferroic circuit element exhibits an inductive characteristic. In some embodiments, the substrate is a PCB or the package of an electronic component. The ferroic circuit may protect an electronic component against an overvoltage event, such as an ESD event.

In various embodiments, an electronic device comprises a ferroic circuit element including a ferroic VSD material and a set of conductive structures that are at least partially embedded within the ferroic VSD material. The set of conductive structures and the VSD material may cause the ferroic circuit element to exhibit a frequency-dependent impedance. In some embodiments, the set of conductive structures comprises at least a portion of a coil, and the ferroic circuit element exhibits an inductive characteristic.

Various aspects of a ferroic circuit element comprise a ferroic medium and a set of conductive structures that are at least partially embedded within the ferroic medium. The ferroic medium and the set of conductive structures are at least partially embedded within a substrate. In some embodiments, the set of conductive structures comprises at least a portion of a coil, and the ferroic circuit element exhibits an inductive characteristic. The substrate may be a PCB or the package of an electronic component. In some embodiments, the set of conductive structures comprises at least two plates, and the ferroic circuit element exhibits a capacitive characteristic. In various embodiments, the ferroic circuit and the electronic component are disposed within a mobile phone, electronic tablet, electronic reader, mobile computer, desktop computer, server computer, television set, video display, music player, personal health management device, light emitting diode (LED), and/or device comprising an LED.

BRIEF DESCRIPTION OF THE DRAWINGS

Embodiments described herein may be referenced to any one or more of the following figures.

DETAILED DESCRIPTION

Figure 1A:
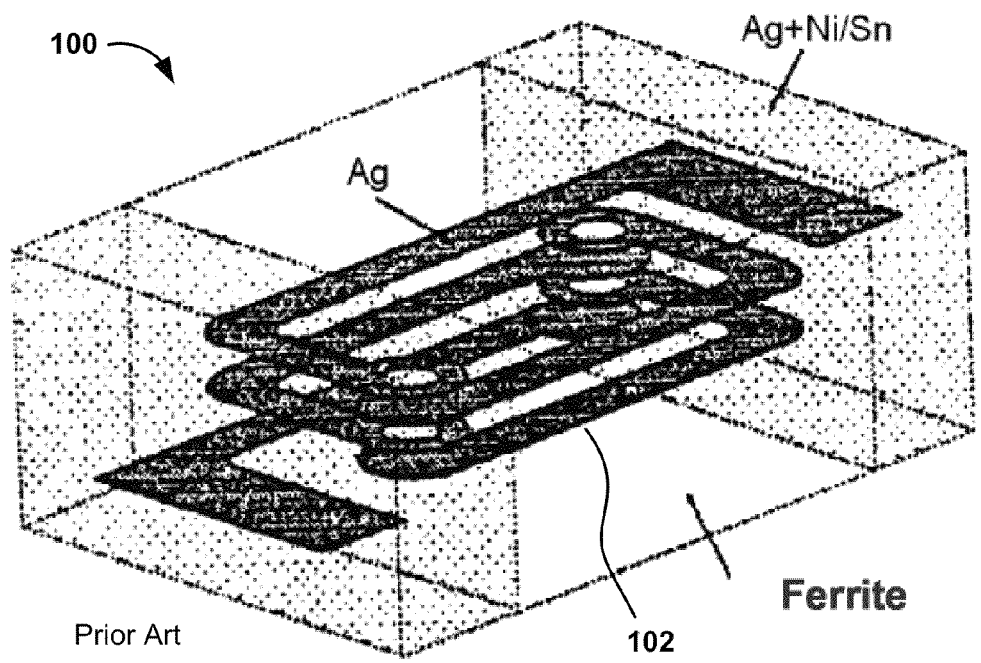
FIG. 1A shows a block diagram of a discrete ferroic inductor in the prior art, as described in a document from Shenzhen Sunlord Electronics Co. (Shenzhen), dated Feb. 10, 2007 (the Shenzhen Presentation).
Figure 1B:
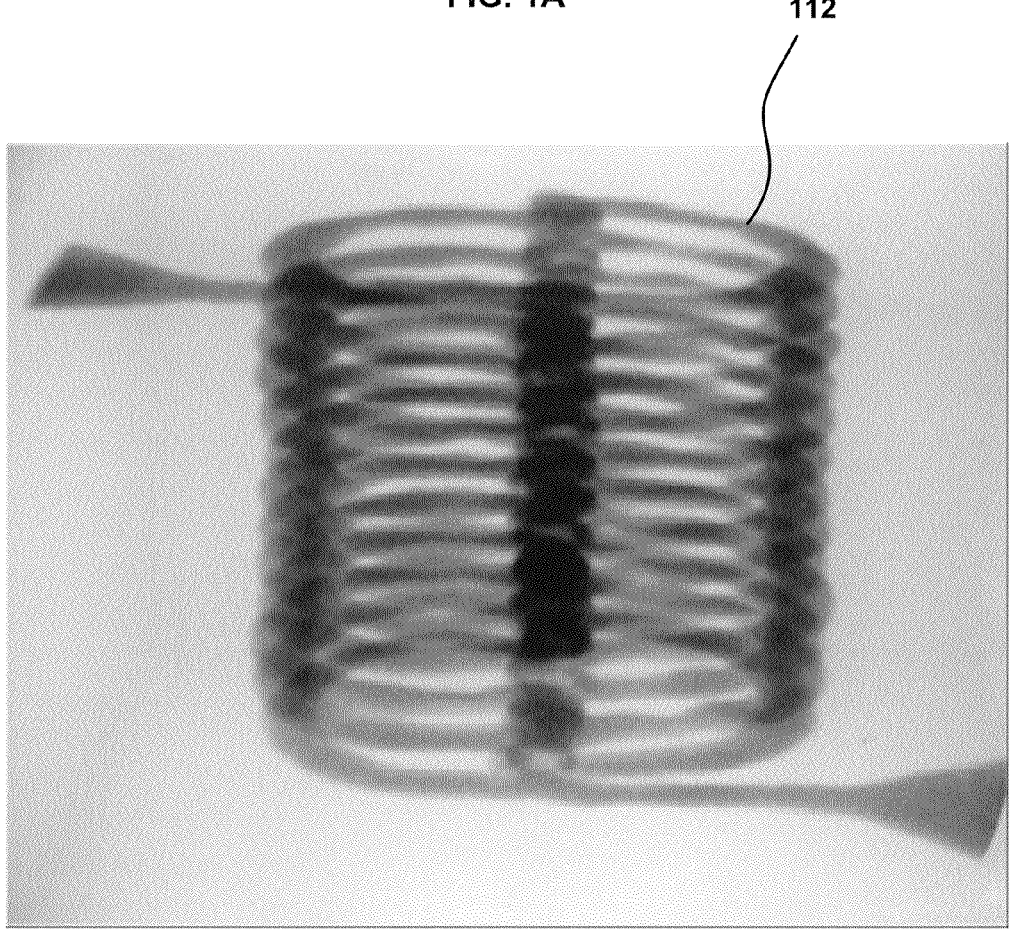
FIG. 1B shows an X-Ray view of the discrete ferroic inductor of FIG. 1A, in accordance with the Shenzhen Presentation.
Figure 1C:
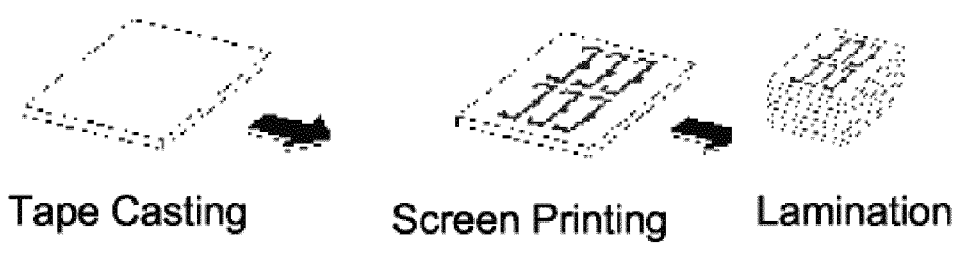
FIG. 1C and FIG. 1D illustrate a manufacturing process for a discrete ferroic inductor, in accordance with the Shenzhen Presentation.
Figure 1D:
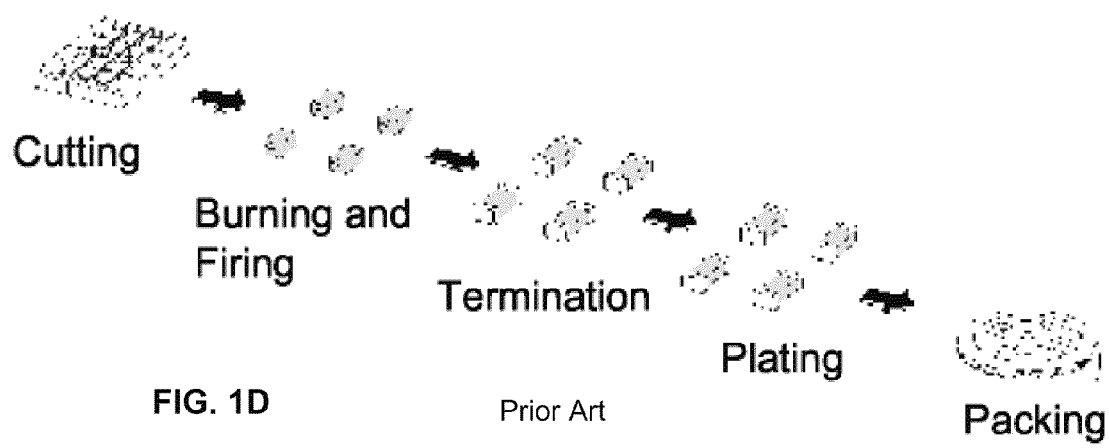

Protection against overvoltage events in a device in accordance with various embodiments of the present invention may include incorporating a voltage switchable dielectric material ("VSD material" or "VSDM") in the device. While those skilled in the art will recognize that overvoltage events encompass multiple events, ESD (electrostatic discharge) may be used herein to generally describe an overvoltage event. In general, a VSD material may have a limited ability to conduct current or otherwise operate in the presence of high signal voltages, current intensities, and energy or power levels before being damaged, possibly irreversibly damaged. Additionally, a VSD material may also be damaged if an electric signal that is normally within operating specifications persists for too long (e.g., the VSD material may heat up while conducting such signals and eventually break down). For example, a VSD material may be able to function normally when exposed to an input signal with a voltage level of 10 KV that lasts less than 100 nanoseconds, but may be damaged if that signal continues to be applied for more than a few milliseconds. The ability of a VSD material to tolerate high levels of voltage, current, power or energy before becoming damaged may depend on various factors, such as the particular composition of the VSD material, the specific characteristics of a corresponding VSD material structure (e.g., a VSD material structure with larger physical dimensions may be able to conduct higher current densities), the corresponding circuit architecture, the presence of other ESD protective components, and the characteristics of the device in which the VSD material is incorporated.

In various embodiments, the VSD material is embedded in the device as a layer or a structure and configured to shunt at least a portion of an ESD signal safely through the device to a ground or to otherwise conduct at least a portion of an ESD signal to a predefined point. In one embodiment, a protective circuit such as a filter is incorporated in the device for communicating useful signals and blocking high frequency components of the overvoltage while the VSD material responds to the rise in voltage when an ESD occurs. The filter may also be embedded in the device as a layer, a structure, or a via.

A VSD material in accordance with various embodiments of the present invention is a material that exhibits nonlinear resistance as a function of voltage. While a VSD material exhibits nonlinear resistance, not all materials that exhibit nonlinear resistance are VSD materials. For example, a material for which resistance changes as a function of temperature but does not substantially change as a function of voltage would not be construed as a VSD material for purposes of embodiments of the present invention. In various embodiments, VSD materials also exhibit nonlinear resistance variation as a function of additional operating parameters such as current, energy field density, light or other electromagnetic radiation input, and/or other similar parameters.

The variation of the resistance as a function of voltage exhibited by a VSD material includes a transition from a state of high resistance to a state of low resistance. This transition occurs at about a specific voltage value, which may be variously referred to as a "characteristic voltage," "characteristic voltage level," "switching voltage," or "switching voltage level." The characteristic voltage may differ for various formulations of VSD material, but is relatively stable for a given formulation. The characteristic voltage for a particular formulation may be a function of parameters such as temperature and/or incident electromagnetic energy at various wavelengths including optical, infrared, UV, microwave, and/or the like.

For a given VSD material composition, the characteristic voltage level may be defined as a voltage per unit of length. In this case, the effective voltage that must be applied to a structure of VSD material before the characteristic voltage level is reached (and consequently the VSD material material becomes substantially conductive) may be a function of the amount, volume, depth, thickness, width or length of the VSD material disposed between the two points where the voltage is applied (and possibly also a function of the relative shape, geometry, density variation, and other analogous variables relating to the VSD material structure). In these instances, a characteristic voltage level may be defined in terms of Volts per mil (V/mil) or Volts per millimeter (V/mm).

Conversely, for a structure of VSD material with a known distance between two points where a voltage is applied (e.g., when the thickness of a VSD material layer is known and a voltage is applied across the thickness of the layer), the characteristic voltage may be defined as an absolute voltage (e.g., the switching for voltage for this VSD material structure may be specified as a specific value in Volts).

Consequently, the characteristic voltage of a VSD material may be defined as a voltage value per unit length or as a specific voltage value, depending on whether the VSD material is being considered as a VSD material structure with an undefined physical shape, dimension, or volume, or as a specific structure with known dimensional characteristics. For the sake of simplicity, the descriptions in this patent may refer to characteristic voltages in terms of absolute voltage values in connection with various embodiments, but in each case the corresponding characteristic voltage in terms of Volts per unit length may be obtained through an appropriate conversion by taking into account the dimensional characteristics of the respective VSD material structure.

A VSD material may behave substantially as an insulator since it is substantially non-conductive (i.e., substantially insulative) at voltages below the respective characteristic voltage level. This may be referred to as an insulation or insulating state. Voltage below the characteristic voltage level may be referred to as low voltage (at least relative to voltages above the characteristic voltage level). In such operating regimes below the characteristic voltage level, a VSD material provided in embodiments of the current invention may also be construed as having attributes of a semiconductor, similar to semiconductor materials that are suitable to serve as substrates in semiconductor manufacturing processes. A VSD material behaves substantially as an insulator for both positive and negative voltages when the magnitude of the voltage is below the characteristic voltage level.

At voltages higher than its characteristic voltage level, a VSD material in accordance with various embodiments of the present invention behaves substantially as a conductor by having substantially no electric resistance, or relatively low resistance. This may be referred to as a conductive state. Voltage above the characteristic voltage level may be referred to as high voltage. The VSD material is conductive or substantially conductive for both positive and negative voltages when the magnitude of the voltage is above the characteristic voltage level. The characteristic voltage may be either positive or negative.

In an ideal model, the operation of a VSD material provided in various embodiments of the present invention is approximated as having infinite resistance at voltages below the characteristic voltage, and zero resistance at voltages above the characteristic voltage. In normal operating conditions, however, VSD materials typically have high, but finite resistance at voltages below the characteristic voltage, and low, but nonzero resistance at voltages above the characteristic voltage. As an example, for a particular VSD material, the ratio of the resistance at low voltage to the resistance at high voltage may be expected to approach a large value (e.g., in the range of $10^3$, $10^6$, $10^9$, $10^{12}$, or higher). In an ideal model, this ratio may be approximated as infinite, or otherwise very high.

The VSD material provided in various embodiments of the present invention exhibits high repeatability (i.e., reversibility) in its operation in both the low voltage regimes and the high voltage regimes. In some embodiments, the VSD material behaves substantially as an insulator or dielectric (i.e., is substantially nonconductive and exhibits a very high or substantially infinite electric resistance) at voltages below the characteristic voltage level. The VSD material then switches to become substantially conductive when operated at voltages above the characteristic voltage level, then becomes again substantially an insulator or dielectric at voltages below the characteristic voltage. The VSD material can continue to alternate between these two operational states an indefinite number of times if the input voltage levels transition between voltages below the characteristic voltage and above the characteristic voltage. While transitioning between these two operational states, a VSD material may experience a certain level of hysteresis, which may alter to a certain extent the characteristic voltage level, the switching response time, or other operational characteristics of the VSD material.

The VSD material provided in various embodiments of the present invention exhibits consistency (i.e., predictable behavior) in its operation in the low and high voltage regimes. In various embodiments, the VSD material responds to various voltages below the characteristic voltage level in substantially similar ways (e.g., the output signals of the VSD material are substantially predictable for a wide range of input signals with voltages below the characteristic voltage level). At low voltages, the VSD material may be expected to be generally bounded within a limited signal envelope. For example, in response to a given input signal, the output signal shape may be expected to stay within a specific voltage response band. Analogously, in various embodiments, the VSD material responds to various voltages above the characteristic voltage level in substantially similar ways. For example, the output signals of the VSD material are substantially predictable for a wide range of input signals with voltages above the characteristic voltage level. Thus, the VSD material may be expected to be generally bounded within a limited signal envelope band (e.g., in terms of signal amplitude, energy, response times, phase, and/or bandwidth).

The transition between the low voltage regime when the VSD material is substantially insulative and the high voltage regime when the VSD material is substantially conductive in accordance with embodiments of the current invention is substantially predictable and is expected to be generally confined to a limited envelope of signal amplitudes and a limited range of switching times. In an ideal model, the time that it takes a VSD material to transition from a state of substantial insulation to a state of substantial conductance in response to an input step function signal that rises above the characteristic voltage may be approximated as zero. That is, the transition may be approximated as substantially instantaneous. Similarly, in an ideal model, the time that it takes a VSD material to transition from a state of substantial conductance to a state of substantial non-conductance in response to an input step function signal that drops below the characteristic voltage may be approximated as zero. This reverse transition may also be approximated to be substantially instantaneous. Under normal operating conditions, however, both of these transition times for VSD materials are non-zero. In general, such transition times are small, and are preferably as small as possible (e.g., in the range of about $10^{-6}$ seconds, $10^{-9}$ seconds, $10^{-12}$ seconds, or smaller). For further details of the formulations and characteristics of VSD material, please refer to U.S. Pat. No. 7,872,251, issued Jan. 18, 2011, to Kosowsky, et al., and titled "Formulations for Voltage Switchable Dielectric Material Having a Stepped Voltage Response and Methods for Making the Same," which is hereby incorporated by reference in its entirety.

When in a substantially conductive state, a VSD material in accordance with various embodiments of the present invention provides a shunt for an input electrical signal to ground or to another predetermined point within the respective circuit or device to protect an electronic component. In various embodiments, the predetermined point is a ground, virtual ground, shield, safety ground, and the like. Examples of electronic components that may be operated with and/or protected by VSD materials in accordance with various embodiments of the present invention include (a) circuit element, circuit structure, surface mounted electric component (e.g., resistors, capacitors, inductors), PCB or other circuit board, electronic device, electronic subsystem, electronic system, (b) any other electric, magnetic, microelectromechanical structure (MEMS) or similar element, structure, component, system and/or device, (c) any other unit that processes or transmits data and operates using electric signals or may be damaged by electric signals, and (d) any combination of the foregoing identified in (a), (b) and/or (c) above.

A VSD material in various embodiments may provide separation between conductors and/or circuit elements by being disposed within a gap to fill the gap at least partially or to otherwise span the gap, by being disposed on a surface as a layer or as a physical structure, or by being embedded at least partially within a substrate, such that at normal voltages below the characteristic voltage level the respective conductors and/or circuit elements are substantially not in electrical communication. At voltages above the characteristic voltage level, current may pass between the respective conductors and/or circuit elements through the VSD material.

VSD materials in accordance with various embodiments of the present invention are polymer-based, and may include filled polymers. A filled polymer may include particulate materials such as metals, semiconductors, ceramics, and the like. Examples of various compositions of VSD materials that may be used in accordance with various embodiments of the present invention are described in, for example, US Patent Publication Number US 2011/0062388-A1, published Mar. 17, 2011.

In accordance with various embodiments of the invention, a VSD material may include one or more ferroic materials. A VSD material that includes one or more ferroic materials may be denoted a "ferroic VSD material."

In some embodiments, one or more such ferroic materials may be introduced in a VSD material polymeric composition as ferroic particles, and such ferroic particles may be distributed within the polymeric composition along with other constituent particles. For example, a VSD material polymeric composition that includes ferroic particles may be mixed for an extended period of time (e.g., 8 hours, 12 hours, or more), until the ferroic particles are distributed substantially uniformly within the composition.

In reference to distribution of particles within a VSD material polymeric composition, distributing particles "substantially uniformly" means that on the average the respective particles are distributed uniformly within the material, but it is certainly possible that in limited subportions of the polymeric composition limited agglomerations of such particles may occur with a certain statistical probability. Overall, however, when considering the whole quantity of VSD material (or a sufficiently large subportion of such VSD material) the respective particles may be deemed to be distributed uniformly within the mixture, and in modeling the behavior of the respective VSD material, the particles may be modeled to be distributed uniformly.

Figure 2A:
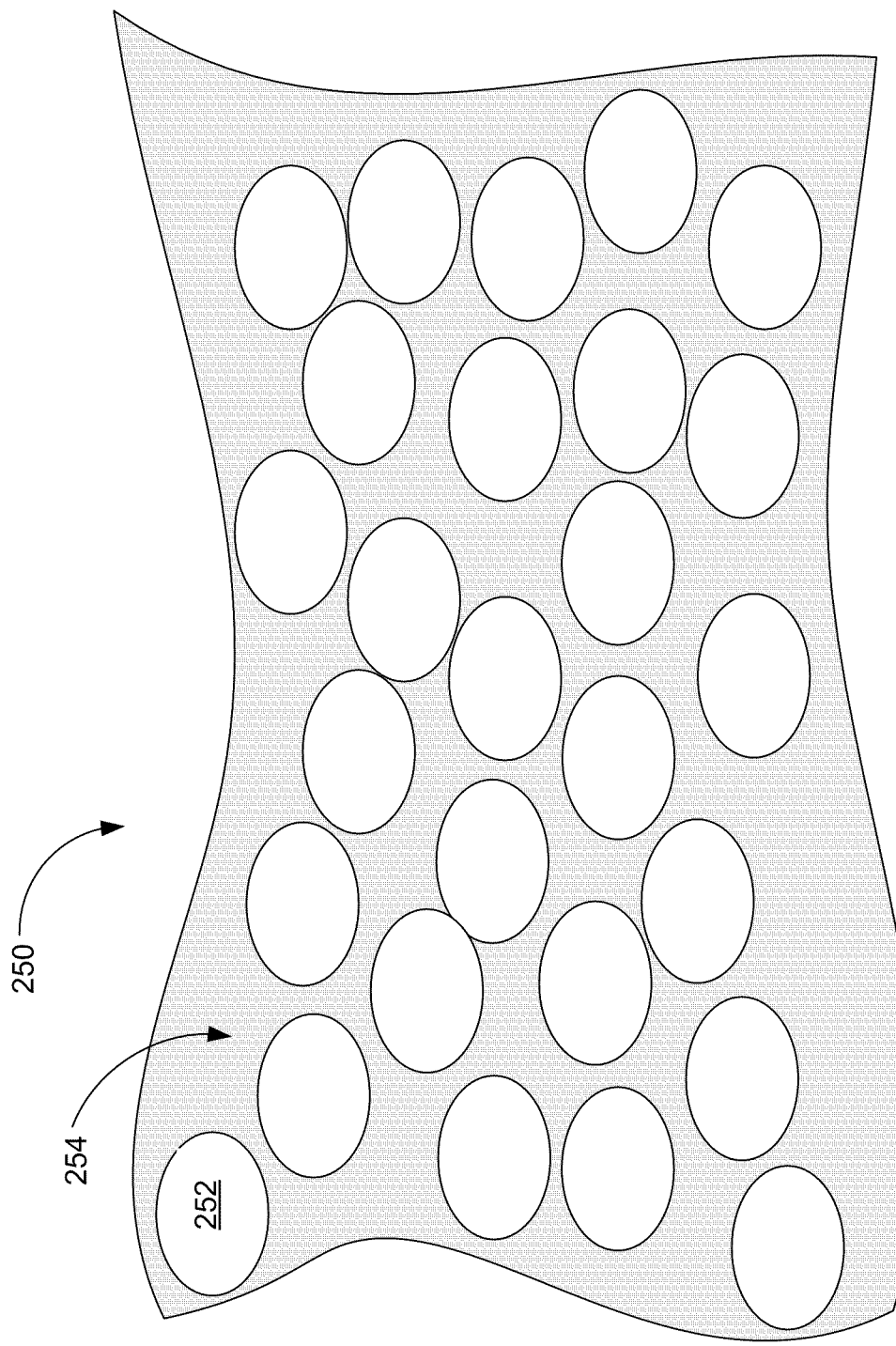
FIG. 2A illustrates an exemplary VSD material that includes ferroic particles in accordance with an embodiment of the present invention.

FIG. 2A illustrates an exemplary VSD material 250 that includes ferroic particles 252. VSD material 250 may include a set of ferroic particles 252 dispersed within a binding medium 254 (e.g., a polymer or solvent).

Ferroic VSD materials, such as the VSD material 250 of FIG. 2A, may include one or more types of ferroic particles 252 or ferroic materials 254, dispersed within an epoxy resin, solvent, or other medium. Such ferroic VSD materials 250 may further include one or more additional types of particles and materials, including carbon nanotubes, other high aspect particles, organic and/or inorganic particles and materials, conductive and/or semiconductor particles or materials, stepped band-gap particles, particles comprising one or more cores surrounded by one or more surface layers, and/or particles comprising one or more surface layers where such surface layers may be modified and/or not modified.

Examples of ferroic particles 252 or ferroic materials 254 that may be introduced in a VSD material composition to produce a ferroic VSD material 250 in accordance with various embodiments of the invention include nickel, niobium, barium titanate, bismuth ferrite, colemanite, other ferrites (e.g., $Fe_2O_3$), ferroelectric polymers, germanium telluride, lead scandium tantalite, lead zirconate titanate, lithium niobate, polyvinylidene fluoride, potassium sodium tartrate, potassium titanyl phosphate, and other materials that have ferroic properties and are otherwise compatible with the respective VSD material compositions.

In one embodiment, a ferroic VSD material 250 includes a combination of the following three types of ferroic particles 252: Iron Oxide ($Fe_3O_4$) in the form of 20-30 nm APS Powder available from Alfa Aesar in a volume proportion of approximately 9%, 4SP-10 Nickel Powder available from Novamet Specialty Products in a volume proportion of approximately 13%, and NFP401S Nickel Powder available from JFE Mineral Company, LTD in a volume proportion of approximately 6%.

In one embodiment, a ferroic VSD material 250 includes a combination of the following type of ferroic particles 252: Iron Oxide ($Fe_3O_4$) in the form of 20-30 nm APS Powder available from Alfa Aesar in a volume proportion of approximately 30%.

In one embodiment, a ferroic VSD material 250 includes a combination of the following two types of ferroic particles 252: 4SP-10 Nickel Powder available from Novamet Specialty Products in a volume proportion of approximately 20%, and NFP401S Nickel Powder available from JFE Mineral Company, LTD in a volume proportion of approximately 8%.

In one embodiment, a ferroic VSD material 250 includes a combination of the following three types of ferroic particles 252: Iron Oxide ($Fe_3O_4$) in the form of 20-30 nm APS Powder available from Alfa Aesar in a volume proportion of approximately 7%, 4SP-10 Nickel Powder available from Novamet Specialty Products in a volume proportion of approximately 20%, and NFP401S Nickel Powder available from JFE Mineral Company, LTD in a volume proportion of approximately 8%.

The characteristic voltage level of the VSD material 250 may change when ferroic particles 252 are dispersed within that material. Consequently, different compositions of the ferroic VSD material 250 may have different characteristic voltage levels, which may be determined experimentally or possibly estimated using various modeling techniques.

A ferroic VSD material 250 may be used to fabricate structures having voltage-dependent properties. For example, a structure may behave as a capacitor or an inductor at low voltages, and behave as a resistor at high voltages. For devices that have an intrinsic frequency-dependent impedance response (e.g., capacitors and inductors), incorporation of the VSD material 250 may result in a device having an impedance that is a function of both frequency and voltage.

In one embodiment, by including one or more ferroic materials 252 (e.g., ferromagnetic, ferroelectric, ferrimagnetic or ferroelastic materials), in a VSD material, the resulting ferroic VSD material 250 acquires an increased magnetic permittivity. Such increased magnetic permittivity may enable the respective ferroic VSD material 250 to perform the traditional function of ferroic materials within inductors, capacitors or other electronic circuit elements that exhibit frequency-dependent impedances. Consequently, a ferroic VSD material 250 may replace ferroic materials within ferroic circuit elements, such as ferroic inductors and ferroic capacitors, where they could also serve overvoltage-protective roles by conducting to ground electric signals that exceed the characteristic threshold voltage of the ferroic VSD material 250.

Figure 2B:
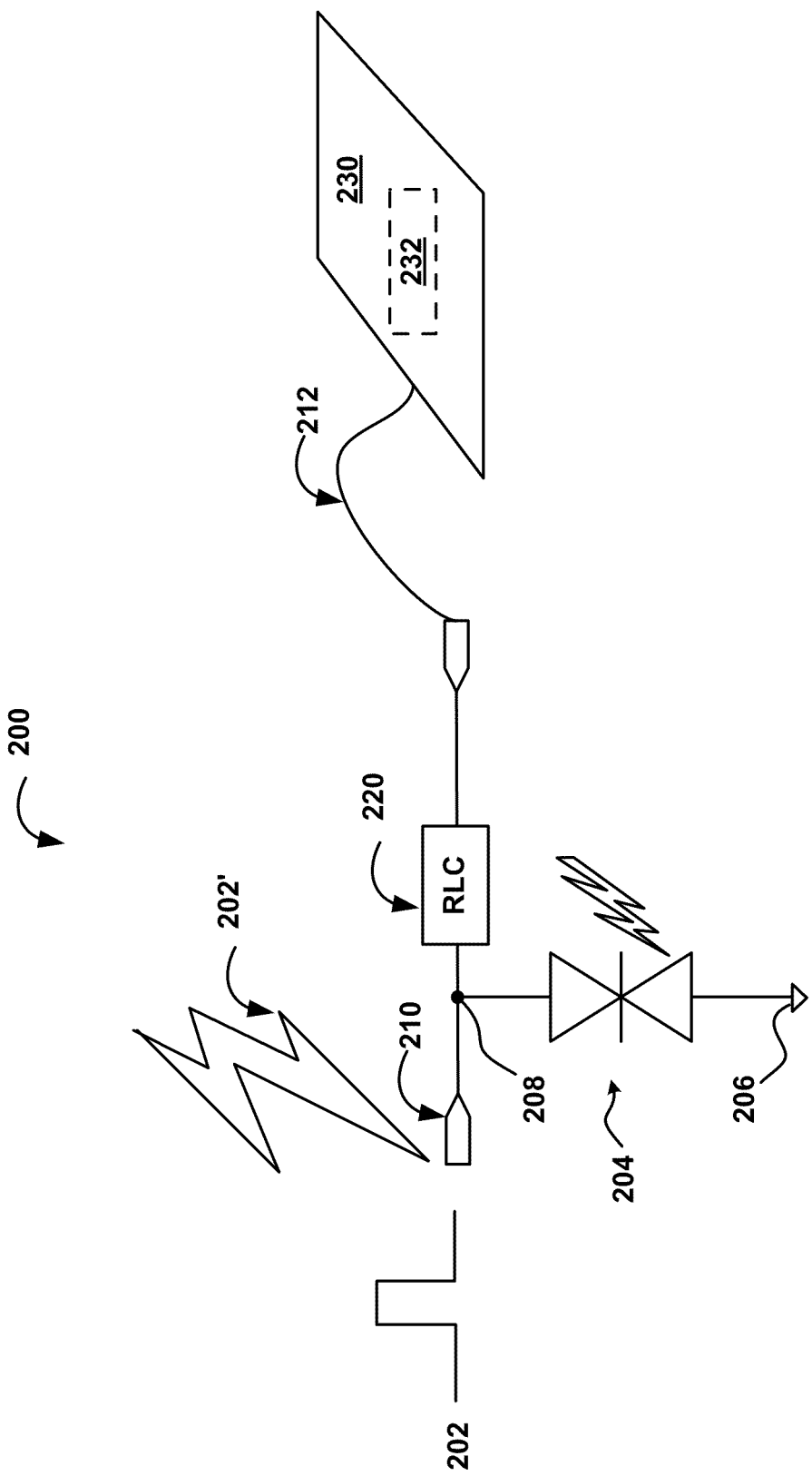
FIG. 2B illustrates a circuit incorporating a VSD material for protecting an electronic component, in accordance with an embodiment of the present invention.

FIG. 2B illustrates a circuit 200 incorporating a VSD material 204 for protecting an electronic component 230 in accordance with an embodiment of the present invention. The circuit 200 may be a device or may be incorporated into a device. In various embodiments, the electronic component 230 includes a chip, resistor, inductor, capacitor, diode, transistor, and/or the like that may be sensitive to an overvoltage condition. The architecture and operation of the circuit 200 shown in FIG. 2B is disclosed in detail in U.S. application Ser. No. 13/096,860, filed Apr. 28, 2011, and titled "Embedded Protection Against Spurious Electrical Events," which is hereby incorporated by reference in its entirety.

The VSD material 204 in the embodiment of FIG. 2B is connected to a conductor 210. The conductor 210 shown in FIG. 2B is part of an electrical path or circuit that transmits a signal 202 to the electronic component 230. A potential incoming overvoltage signal 202', such as an ESD pulse, may be applied to the signal 202 and coupled to the conductor 210. However, the circuit 200 is configured to use the VSD material 204 to limit transmission of potentially damaging portions of the overvoltage signal 202' to the electronic component 230. Overvoltage signal 202' is an electric signal that may exhibit a relatively-high voltage, relatively-high current, or other characteristics that may be damaging to electronic components.

The VSD material 204 of FIG. 2B is illustrated as a device configured to electrically couple a node 208 to a second point 206 when an input voltage exceeds a characteristic voltage level. While FIG. 2B shows the circuit 200 as including a single VSD material 204, it will be readily recognized by those having ordinary skill in the art that two or more implementations of VSD material 204 may be utilized (e.g., a second structure of VSD material may be disposed between conductive lead 212 and a ground or other point similar to second point 206). Moreover, various embodiments of VSD material 204 include VSD material configured as a layer of a substrate, a pattern disposed on a substrate, a device, a device embedded in a substrate, a device embedded in a via, a separation material, and the like. In some embodiments, the VSD material 204 is a structure of VSD material that is embedded in a substrate such as a PCB or another circuit board. The VSD material 204 may be a layer of VSD material or a structure of VSD material that is disposed on a surface of a substrate. The VSD material 204 may be configured as a layer of VSD material or a structure of VSD material that is disposed as a layer inside a substrate, or otherwise parallel with the main horizontal plane of the PCB. The VSD material 204 may also comprise a structure of VSD material that is disposed at least partially in a vertical direction or in an oblique direction relative to the general plane of a substrate (e.g., the VSD material may be constructed as a vertical structure crossing two or more layers of a PCB).

The electronic component 230 may be any of various electronic components, including an ESD-sensitive integrated circuit (e.g., implemented in silicon, III-V materials, II-VI materials, and the like). Optionally, the electronic component 230 includes an on-chip ESD protection element 232. The electronic component 230 of FIG. 2B is in electrical communication with conductor 210 via a conductive lead 212. In some cases, electronic component 230 is a surface-mounted chip (e.g., according to Surface Mounted Device, or SMD, standards).

In accordance with an embodiment of the current invention, circuit 200 includes a circuit element 220 for protection of the electronic component 230 from the overvoltage signal 202'. In various embodiments, the circuit element 220 may be, or may include one or more resistors, one or more inductors, one or more capacitors, one or more diodes, one or more transistors, one or more filters (e.g., various combinations of one or more low-pass, band-pass and high-pass filters or filter stages), any other passive or active circuit elements or electronic components, and any combination of the foregoing. The circuit element 220 may comprise a single electronic component or a combination of electronic components, and may be used to provide partial or full ESD protection for the electronic component 230.

In accordance with an embodiment of the current invention, a circuit element that may be used for protection against ESD and other overvoltage events, such as the circuit element 220 shown in FIG. 2B, is an embedded circuit element manufactured by embedding a conductive structure at least partially within a ferroic material, with the ferroic material being embedded at least partially within a substrate. In one embodiment, a circuit element comprises a set of conductive structures, where at least a subset of the conductive structures are at least partially embedded within a ferroic material, and where the circuit element is embedded at least partially within a PCB. In one embodiment, a circuit element comprises a set of conductive structures, where at least a subset of the conductive structures are at least partially embedded within a ferroic material, and where the circuit element is embedded at least partially within the packaging of a discrete integrated circuit (IC).

A circuit element comprising a conductive structure that is at least partially embedded within a ferroic medium, and where the circuit element is embedded at least partially within a substrate in accordance with embodiments of the current invention may be denoted as an "embedded ferroic circuit element." An embedded ferroic circuit element that is an inductor in accordance with embodiments of the current invention may be denoted as an "embedded ferroic inductor." An embedded ferroic circuit element that is a capacitor in accordance with embodiments of the current invention may be denoted as an "embedded ferroic capacitor."

In accordance with an embodiment of the current invention, a circuit element that may be used for protection against ESD and other overvoltage events, such as the circuit element 220 shown in FIG. 2B, is an embedded inductor element manufactured by embedding a conductive structure at least partially within a ferroic VSD material. In accordance with embodiments of the current invention, a circuit element comprising a set of conductive structures, where at least a subset of the conductive structures is at least partially embedded within a medium that is a ferroic VSD material or that includes a ferroic VSD material, may be denoted as a "ferroic VSDM circuit element" or "ferroic VSD material circuit element."

In one embodiment, a ferroic VSD material circuit element is embedded at least partially within a substrate. A ferroic VSD material circuit element that is embedded at least partially within a substrate in accordance with embodiments of the current invention may be denoted as an "embedded ferroic VSD material circuit element." In one implementation, the substrate is a PCB, and the embedded ferroic VSD material circuit element is embedded at least partially within the PCB. In one implementation, the substrate is the packaging of a discrete integrated circuit (IC), and the embedded ferroic VSD material circuit element is embedded at least partially within the packaging of the discrete integrated circuit.

An embedded ferroic VSD material circuit element that is an inductor in accordance with embodiments of the current invention may be denoted as an "embedded ferroic VSD material inductor." An embedded ferroic circuit element that is a capacitor in accordance with embodiments of the current invention may be denoted an "embedded ferroic VSD material capacitor." Embedded ferroic VSD material circuit elements are further discussed below in connection with an embodiment of FIG. 4B.

For clarification, unless otherwise expressly noted, when used in this patent to refer to the architecture of an embedded ferroic circuit element, a ferroic VSD material circuit element, or an embedded ferroic VSD material circuit element, the term "conductive structure" is intended to refer to a larger conductive structure that is embedded at least partially within a corresponding ferroic material or ferroic VSD material, where such conductive structure performs an inductive, capacitive, resistive or other impedance-related function for the respective circuit element, and is not intended to refer to conductive particles or materials disposed within the corresponding ferroic material or ferroic VSD material to perform ferromagnetic- or VSDM-specific functions. Analogously, unless otherwise expressly noted, when used in this patent to refer to the architecture of an embedded ferroic circuit element, a ferroic VSD material circuit element, or an embedded ferroic VSD material circuit element, the term "conductive structure" is not intended to refer to patterned metal (e.g., copper) traces that are embedded within substrates, are disposed on the surfaces of substrates, or otherwise connect independent inductors, resistors, capacitors or other components in electronic circuits.

For example, unless otherwise expressly noted, when referring to a set of conductive structures within a ferroic VSD material inductor or embedded ferroic VSD material inductor, the respective set of conductive structures may be an inductive coil, a portion of an inductive coil, or multiple inductive coil loops disposed in whole or in part within a VSD material inside the respective ferroic VSD material inductor or embedded ferroic VSD material inductor; unless otherwise noted, however, the respective set of conductive structures would not be a reference to nanoscale conductive particles or materials disposed within the VSD material, such as carbon nanotubes or metal particles.

In one embodiment, a design for overvoltage protection includes VSD material 204 in electrical communication with circuit element 220 and/or with electronic component 230. In some embodiments, the VSD material 204 is in electrical communication with a side (e.g., lead, port, connector, pin, etc.) of circuit element 220 connected to a conductor 210. The VSD material 204 may be connected to an electrical ground or to other components.

In various embodiments, circuit element 220 is or includes an embedded ferroic circuit element, ferroic VSD material circuit element, or embedded ferroic VSD material circuit element that acts as a voltage filter, current amplitude filter and/or frequency filter. For example, the circuit element 220 may be configured as a high pass filter, a low pass filter, or a band pass filter. Circuit element 220 may transmit a first voltage or current (e.g., associated with normal operation of electronic component 230) with no, or substantially no, distortion or attenuation, and may block in whole or in part a second voltage or current associated with abnormal events (e.g., an overvoltage or ESD event). For example, the circuit element 220 may be configured as a low pass filter to transmit the signal 202 at normal or design frequencies. Upon occurrence of an ESD type overvoltage signal 202' including high frequency components, the circuit element 220 may block in whole or in part the high frequency components of the overvoltage signal 202'. The full or partial blocking of the overvoltage signal 202' may provide the VSD material 204 sufficient time to respond to the high voltage regime and switch to a conductive state before the electronic component 230 may be damaged.

An impedance of the circuit element 220 may be selected to pass signal 202 at voltages that would not normally damage electronic component 230 (e.g., voltages below 40 volts, below 24 volts, below 12 volts, below 5 volts, and/or below 3 volts, depending upon the chip specifications). The impedance of the circuit element 220 may be further selected to block overvoltage signal 202' at high and/or potentially damaging voltages (e.g., above 100 volts, above 1000 volts, above 10 kV and the like). The selection of a voltage above which the overvoltage signal 202' is blocked may be based on the component 230 specifications and/or frequency components of the overvoltage signal 202'.

Replacing a discrete ferroic component, such as the discrete ferroic inductor discussed in connection with FIGS. 1A, 1B, 1C and 1D, with an embedded ferroic circuit element in accordance with embodiments of the present invention provides various advantages. Some of those advantages include the following: (a) The embedded ferroic circuit element may be prebuilt into a substrate, such as a PCB, at various times during manufacture of the substrate. Thus, a need to add discrete ferroic components at a later time may be avoided. (b) Design of ESD protection for a device can be performed at a higher level (e.g., at a system level or PCB level). Thus, overvoltage protection can be optimized across multiple components or across an entire system or subsystem. In contrast, using discrete ferroic components often leads to no optimization beyond the specific component or components being protected. (c) The cost of using discrete ferroic components may be avoided or substantially decreased by using embedded ferroic circuit elements that are prebuilt into a substrate.

In accordance with various embodiments of the present invention, the VSD material 204, circuit element 220, and component 230 of FIG. 2B are incorporated within an electronic device. For example, the electronic component 230 protected by a structure of VSD material 204 and by the circuit element 220 may be a semiconductor chip or another integrated circuit (IC) (e.g., a microprocessor, controller, memory chip, RF circuit, baseband processor, etc.), light emitting diode (LED), MEMS chip or structure, or any other component or circuit element that is disposed inside an electronic device.

Examples of such electronic devices that may include components protected against ESD events or other electrical input signals in accordance with embodiments of the present invention include mobile phones, electronic tablets, electronic readers, mobile computers (e.g., a laptop), desktop computers, server computers (e.g., servers, blades, multi-processor supercomputers), television sets, video displays, music players (e.g., a portable MP3 music player), personal health management devices (e.g., a pulse monitor, a cardiac monitor, a distance monitor, a temperature monitor, or any other sensor device with applications in health management), light emitting diodes (LEDs) and devices comprising LEDs, lighting modules, and any other consumer and/or industrial devices that process or otherwise store data using electrical or electromechanical signals. Other examples include satellites, military equipment, aviation instruments, and marine equipment.

The overvoltage signal 202' may arrive via a predetermined electrical path in the device (e.g., on a signal line in an electrical circuit, through a conductive line in a PCB), or may arrive via an unintended path (e.g., arcing through the air from a data port that is accessible from outside the device, along an unintended conductive or partially conductive path from the external cover of a mobile phone).

The VSD material 204 of FIG. 2B is disposed between the node 208 and the second point 206. In various embodiments, one or both of the node 208 and the second point 206 is internal to a substrate (e.g., embedded in a layer of a PCB), on a surface of a substrate (e.g., on a conductive line on a surface of a PCB), or external to the substrate (e.g., on a connector or pin connected to a PCB).

In one embodiment, the VSD material 204 and the circuit element 220 are incorporated in a connector that connects to a device to be protected against overvoltage events and the electronic component 230 is incorporated in the device. Examples of such connectors include a power connector, a USB connector, an Ethernet cable connector, an HDMI connector, or any other connector that facilitates serial, parallel or other types of data, signal or power transmission.

In one embodiment, the VSD material 204 is incorporated in a connector that connects to a device to be protected against overvoltage events and the circuit element 220 and the electronic component 230 are incorporated in the device. In such embodiments, a structure of VSD material and a ferroic circuit element (including any embedded ferroic circuit element) can be built directly into a cable to be connected to a device, and can provide ESD or other overvoltage signal protection to the respective device once the cable is connected. Such embodiments can be used to enhance the value of connectors and/or decrease the probability of ESD damage experienced by devices.

The node 208 is included in a path along which a potentially damaging electrical signal may travel, such as the overvoltage signal 202'. As shown in FIG. 2B, the circuit element 220 and the VSD material 204 are directly connected to the node 208. In some embodiments, additional components may be disposed between the node 208 and the VSD material 204, and/or between the node 208 and the circuit element 220.

In various embodiments, the second point 206 is a ground, virtual ground, a shield, a safety ground, a package shell, a conductive line, a direct or indirect connection to a component, a point along any other electrical path, or any combination of the foregoing. While the second point 206 is shown in FIG. 2B as directly connected to a ground, the second point 206 may be virtually any predetermined net, potential or other reference or point within the device to which the overvoltage signal 202' may be directed in whole or in part or from which an electrical signal may be received.

In some embodiments, the VSD material 204 provides partial overvoltage protection to the component 230. Upon occurrence of an overvoltage signal 202', such as an ESD pulse, the VSD material 204 switches to a substantially conductive state. Upon becoming substantially conductive, the VSD material 204 is configured to shunt at least a first portion of the overvoltage signal 202' to the second point 206, thus, attenuating the overvoltage signal 202' at the node 208. In this configuration, an attenuated second portion of overvoltage signal 202' may reach the electrical component 230 rather than the full overvoltage signal 202'. By redirecting at least a portion of the overvoltage signal 202' to the second point 206, and transmitting the attenuated portion of the overvoltage signal 202' to the component 230, the VSD material 204 prevents the redirected portion of the overvoltage signal 202' from reaching the component 230, thus, providing at least partial overvoltage protection to the component 230.

The attenuated portion of the overvoltage signal 202' may be further attenuated using the circuit element 220. The attenuated portion of overvoltage signal 202' at node 208 may be further attenuated using the circuit element 220 before reaching the component 230, in which case the component 230 receives a smaller portion of the overvoltage signal 202' than is present at the node 208.

In some embodiments, the attenuated portion of the overvoltage signal 202' that is transmitted to the component 230 experiences a voltage drop across the circuit element 220. By controlling this voltage drop (e.g., through appropriate design specifications produced in accordance with protector characteristics developed as discussed below in connection with the embodiment of FIG. 3), the voltage and current received at the component 230 may be decreased to non-damaging or otherwise predetermined levels.

Alternatively, in one embodiment, the entire overvoltage signal 202', or substantially the entire overvoltage signal 202', is transmitted by the VSD material 204 to the second point 206. In this case, no current or voltage, or substantially no current or voltage, of the overvoltage signal 202' is routed from the node 208 to the component 230.

In one embodiment, the clamping voltage of the VSD material 204 (i.e., the voltage that may be measured at the node 208 when the VSD material has become substantially conductive) is higher than the maximum voltage that could be safely tolerated by the component 230. Consequently, in this embodiment, an impedance of circuit element 220 may be configured for further attenuation of the current and/or voltage experienced at the lead 212 to a decreased level that can be more safely tolerated by the component 230.

In general, various embodiments of the invention may provide protector characteristics that can be implemented to produce a circuit element 220 having a transfer function that attenuates or suppresses any or all of the signal characteristics of various components of the overvoltage signal 202' present at the node 208 that could damage the component 230. Examples of signal characteristics of overvoltage signals or of other electrical signals that can be attenuated or suppressed by a circuit element in accordance with embodiments of the current invention include voltage, current, frequency and/or bandwidth (e.g., an expected frequency spectrum), time value, and/or pulse shape.

The circuit element 220 may be configured to temporarily block the overvoltage signal 202' while the VSD material 204 switches to the conductive state. In some embodiments, the overvoltage signal 202' includes a pulse, such as an ESD pulse, having a leading edge that rises rapidly. While the VSD material 204 may be configured to switch quickly, the response time of VSD materials is generally subject to a nonzero time delay. The leading edge of some ESD pulses may rise faster than the response time of the VSD material 204 in the circuit 200. Thus, the voltage at the node 208 can momentarily exceed the damage threshold of the electronic component 230. The circuit element 220 may include elements, such as a low pass filter, configured to block high frequency components such as may characterize fast rising pulses. In some embodiments, the circuit element 220 blocks the rising pulse when it is at a voltage level that is less than the characteristic voltage of the VSD material 204. That is, to provide the electronic component 230 with additional protection, the circuit element 220 may be configured to block the overvoltage event before the VSD material 204 begins switching. Thus, the circuit element 220 can block one or more characteristics or components of the overvoltage signal 202' (e.g., the rising edge of a pulse in the overvoltage signal 202') during the time it takes for the VSD material 204 to switch from the insulation state to the conductive state.

In various embodiments, the predetermined point to which a VSD material reroutes at least part of the input electrical signal may be a ground or may be the input to one or more other electronic components, different from the electronic component being protected. In the embodiment of FIG. 2B, the point to which the VSD material 204 reroutes at least a portion of the overvoltage signal 202' is the second point 206, which is illustrated as connected directly to ground.

In various embodiments, a structure of VSD material 204 is embedded in a substrate. When it becomes substantially conductive, the VSD material 204 provides an electrical path through the substrate to the second point 206. An embedded structure of VSD material in accordance with various embodiments of the present invention provides numerous advantages over traditional discrete components that may have been used in the prior art as part of ESD protection circuits. Examples of traditional discrete ESD components that may have been used in the prior art as part of ESD protection circuits include capacitors, resistors, inductors, diodes, discrete components (including, possibly, discrete components manufactured with voltage switched dielectric materials, but where such discrete components were not in any event embedded in any substrate or in any other component or portion of a device such as a PCB), and combinations of the foregoing.

Embedding a structure of VSD material, such as VSD material 204, in a substrate in accordance with various embodiments of the present invention provides various advantages. Some of those advantages include the following: (a) The embedded VSD material structures may be prebuilt into a substrate, such as a PCB, at various times during manufacture. Thus, a need to add discrete ESD components at a later time may be avoided. (b) Design of the ESD protection can be performed at a higher level (e.g., at a system level or PCB level). Thus, ESD protection can be optimized across multiple components or across an entire system or subsystem. In contrast, using discrete ESD components may lead to little or no optimization beyond the specific component or components being protected. (c) The cost of using discrete ESD components may be avoided or substantially decreased by using embedded structures of VSD material that are prebuilt into the substrate.

In various embodiments of the present invention, various combinations of VSD material 204, the circuit element 220, and the electronic component 230 may be embedded in a single substrate or in a plurality of substrates that are in electrical communication with each other. In some embodiments, VSD material 204 and/or circuit element 220 are embedded in a printed circuit board (e.g., fabricated as layers in a PCB stackup). In some embodiments, circuit element 220 includes a via. Optionally, the circuit element 220 is implemented in a via, and that via may be filled with a material having appropriate properties. For example, a via filled with a resistive paste (e.g., silver paste) may have a desired resistance (e.g., a higher resistance than a plated via, but a low enough resistance to conduct a desired current). In some cases, the filled via (operating as circuit element 220 and/or lead 212) connects a VSD material embedded in a layer to a component (e.g., a chip) disposed on another layer or otherwise attached to the substrate.

A ferroic material may be disposed as a layer. In some cases, a layer of ferroic material may be a ferroic VSD material, and appropriate wiring may be used to fabricate structures that take advantage of ferroic and/or VSD material properties. In some embodiments, a device may be fabricated from an embedded layer, which may eliminate or reduce the need for a surface mount device. In some cases, an embedded inductor may replace (or reduce the required size of) a surface mount inductor. An embedded capacitor may replace (or reduce the required size of) a surface mount capacitor.

Figure 3:
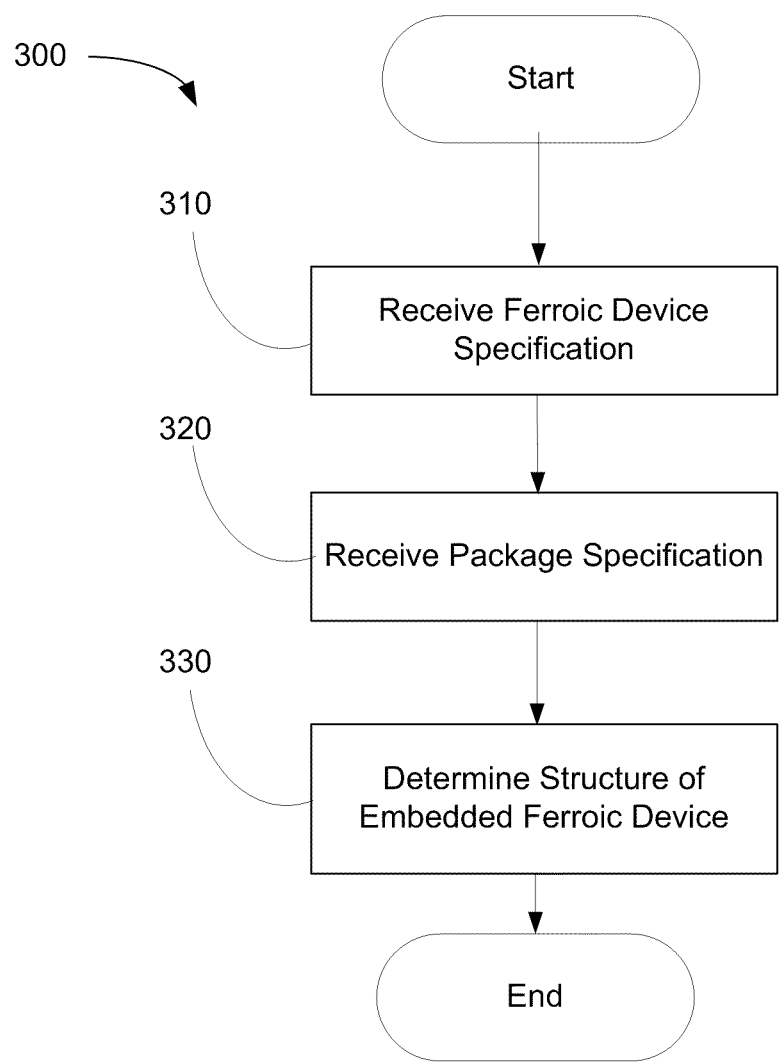
FIG. 3 illustrates an exemplary method for designing overvoltage protection capability for an electronic component, in accordance with an embodiment of the present invention.

FIG. 3 illustrates an exemplary method 300 for designing overvoltage protection capability for an electronic component, in accordance with an embodiment of the present invention. Method 300 provides for designing a circuit element, such as circuit element 220, where such circuit element is or includes an embedded ferroic circuit element, ferroic VSD material circuit element, and/or embedded ferroic VSD material circuit element.

In step 310 of the embodiment of FIG. 3, a specification for a ferroic device is received. In various embodiments, the embedded ferroic device includes a circuit element, ferroic VSD material circuit element, and/or embedded ferroic VSD material circuit element, possibly embedded in a substrate (e.g., in a PCB or IC package). In various embodiments the specification includes a required impedance, frequency response, capacitance, and/or the like, in addition to specifications for components (e.g., a chip) connected to the device. Exemplary chip specifications include a desired band pass, band block, impedance, maximum voltage, maximum current, maximum power, frequency range, frequency response, and/or temporal dependence thereof, which may be expected to damage the chip and/or package.

In step 320, package specifications are received. Package specifications may include a PCB design, which may include one or more data describing available "real estate" at one or more layers (e.g., of prepreg) within the package. Package specifications may also include ESD or other overvoltage specifications. ESD specifications may include a voltage, current, frequency, temporal response, and/or other properties associated with an ESD or other overvoltage event against which the chip may be protected.

In step 330, a structure of an embedded ferroic device is determined. In some cases, the structure of the embedded ferroic device includes conductive lines and/or vias that may be combined with a filled ferroic material or ferroic VSD material to create a capacitor, inductor, resistor, and/or other ESD protection device. In some cases, the structure of the embedded ferroic device includes an embedded ferroic circuit element, ferroic VSD material circuit element, and/or embedded ferroic VSD material circuit element that may be disposed as one or more layers within a prepreg stackup.

In various embodiments, an embedded ferroic device (such as an embedded ferroic circuit element, ferroic VSD material circuit element, and/or embedded ferroic VSD material circuit element) is a protector that protects a component against overvoltage events, such as the electronic component 230 shown in the embodiment of FIG. 2B. Protector specifications may include an equivalent circuit whose properties are expected to result in the desired response. Protector specifications may include a number of resistors, inductors, and/or capacitors, and the like. Protector specifications may include connectivity between and among various resistors, inductors, capacitors, and the like. Protector specifications may include the presence (or not) of a VSD material, and may include properties of the VSD material (e.g., switching voltage, clamp voltage, trigger voltage, and the like).

Figure 4A:
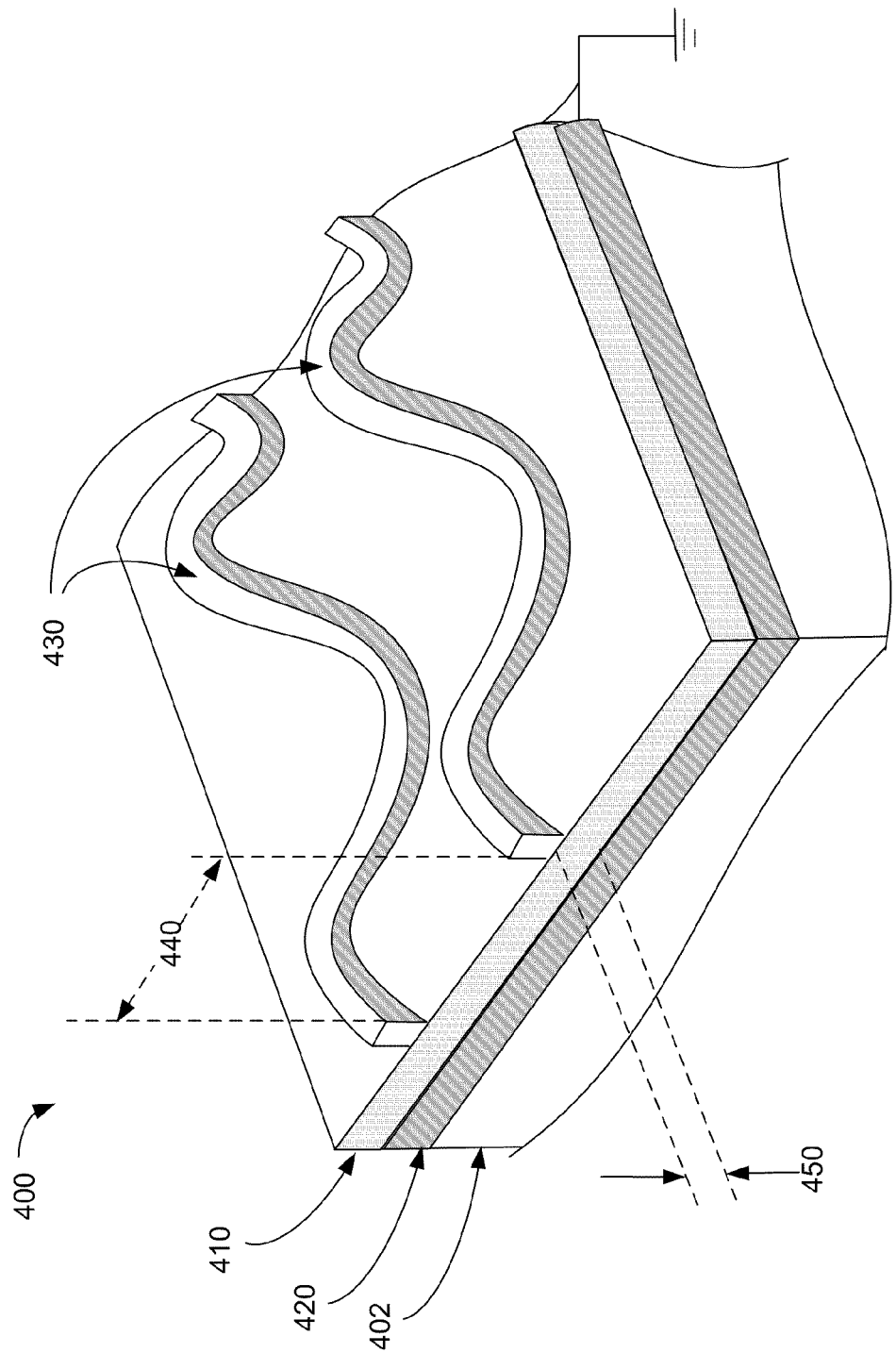
FIG. 4A shows a portion of an exemplary structure or stackup illustrating the architecture of an embedded ferroic circuit element, ferroic VSD material circuit element, or embedded ferroic VSD material circuit element, in accordance with an embodiment of the present invention.

FIG. 4A shows a portion of an exemplary structure or stackup 400 illustrating the architecture of an embedded ferroic circuit element, ferroic VSD material circuit element, or embedded ferroic VSD material circuit element. In one embodiment, the exemplary structure shown in FIG. 4A may be the circuit element 220 shown in the embodiment of FIG. 2B. In this example, the structure 400 includes a substrate 402 (such as a printed circuit board and/or layer thereof) and/or other assembly. In one embodiment, the structure 400 does not include a substrate, but is attached to a substrate (e.g., a PCB) or is otherwise embedded at least partially within a substrate (e.g., a PCB, via of a PCB, or the package of an IC). The structure 400 in the embodiment of FIG. 4A comprises a ferroic material 410, which may be a ferroic VSD material 410. A conductive plane, illustrated as conductive plane 420, is in contact with the ferroic material 410. The conductive plane 420 may be embedded at least partially within the ferroic material 410, or may be otherwise in contact with the ferroic material 410. Conductive plane 420 may be connected to a ground. In various embodiments, conductive plane 420 includes any of the following: a conductive plane or portion of conductive plane (e.g., a layer in a PCB), a conductive trace, a conductive pattern, a conductive lead, a conductive element, a pin, or any other structure, surface or volume that can conduct current.

A conductive structure, illustrated in FIG. 4A as one or more conductors 430, may be embedded partially or completely within the ferroic material 410. Conductors 430 may be separated by a first gap 440. A conductor 430 may be separated from the conductive plane 420 by a second gap 450. Structure 400 may be embedded in a PCB by adding and processing additional PCB components (e.g., additional layers of prepreg).

In one embodiment, the structure 400 shown in FIG. 4A illustrates a ferroic VSD material inductor that comprises a conductive coil (e.g., conductors 430) embedded at least partially within a ferroic VSD material (e.g., ferroic material 410). In this embodiment, the conductors 430 may be in the shape of a coil (e.g., for example similar to the coil shown in the embodiment of FIG. 1B) and may extend horizontally in a plane parallel with the planes of the ferroic material 410 and conductive plane 420 (as such planes are disposed in FIG. 4A), and/or vertically in a plane perpendicular or otherwise angled relative to the planes of the ferroic material 410 and conductive plane 420 (as such planes are disposed in FIG. 4A). In one embodiment, the ferroic VSD material inductor illustrated in FIG. 4A may be embedded at least partially in a substrate to produce an embedded ferroic VSD material inductor.

In one embodiment, the structure 400 shown in FIG. 4A illustrates a ferroic VSD material inductor that comprises a conductive coil (e.g., conductors 430) embedded at least partially within a ferroic VSD material (e.g., ferroic material 410), and the structure 400 is itself embedded at least partially within a substrate such as a PCB or an IC package.

In one embodiment, the structure 400 shown in FIG. 4A illustrates a ferroic VSD material capacitor that comprises a set of conductive plates (e.g., conductors 430) embedded at least partially within a ferroic VSD material (e.g., ferroic material 410). In this embodiment, the conductors 430 may be in the shape of one or more conductive plates that can act as capacitive plates, and may extend horizontally in a plane parallel with the planes of the ferroic material 410 and conductive plane 420 (as such planes are disposed in FIG. 4A), and/or vertically in a plane perpendicular or otherwise angled relative to the planes of the ferroic material 410 and conductive plane 420 (as such planes are disposed in FIG. 4A). In some embodiments, the ferroic VSD material capacitor comprises two or more layers of conductors 430 and ferroic VSD material 410 interspersed between the conductors 430. The conductors 430 in the two or more layers may be substantially parallel and may substantially overlay.

Figure 4B:
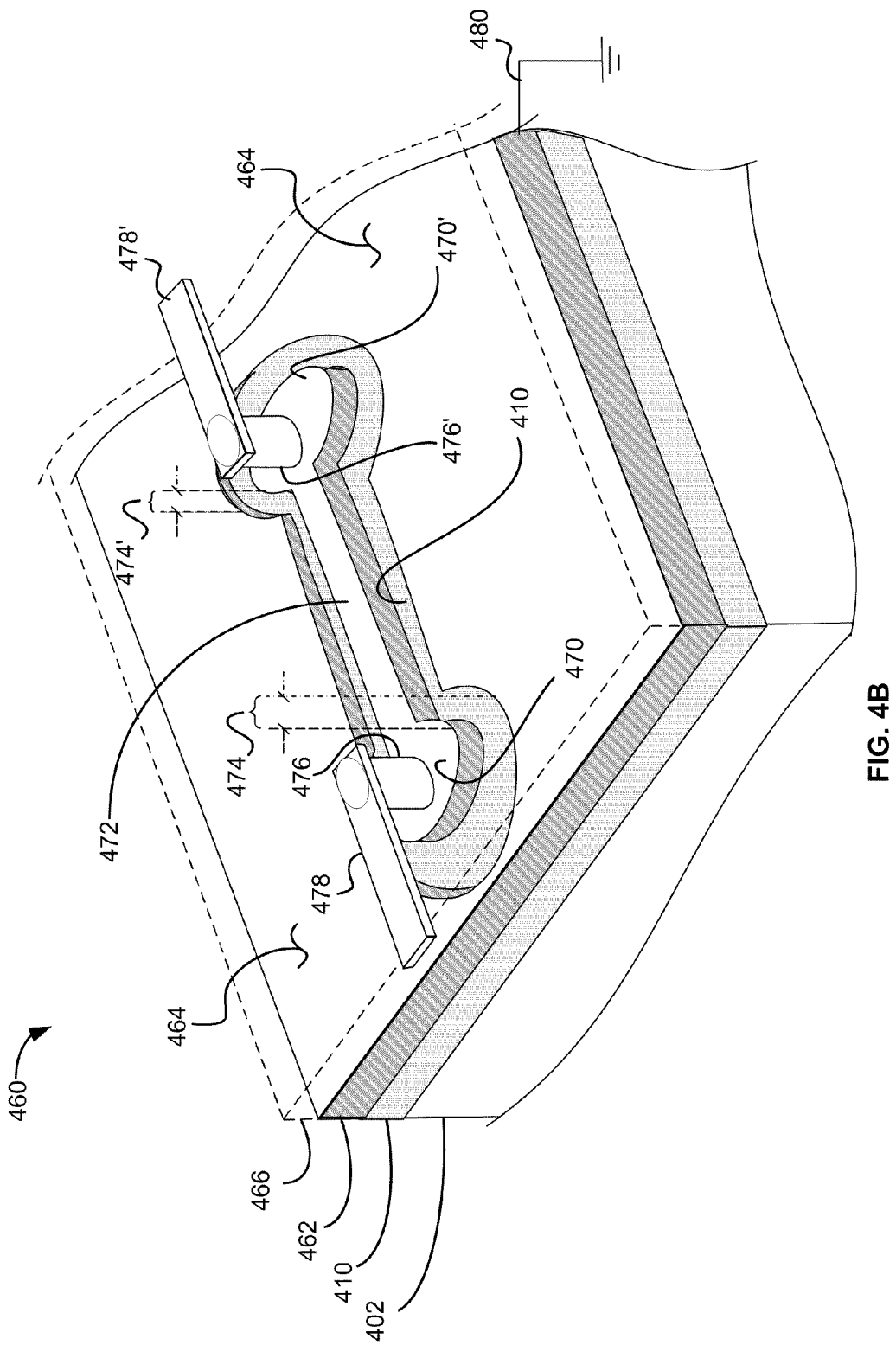
FIG. 4B illustrates a structure of a ferroic VSD material inductor or embedded ferroic VSD material inductor in accordance with an embodiment of the present invention.
Figure 4C:
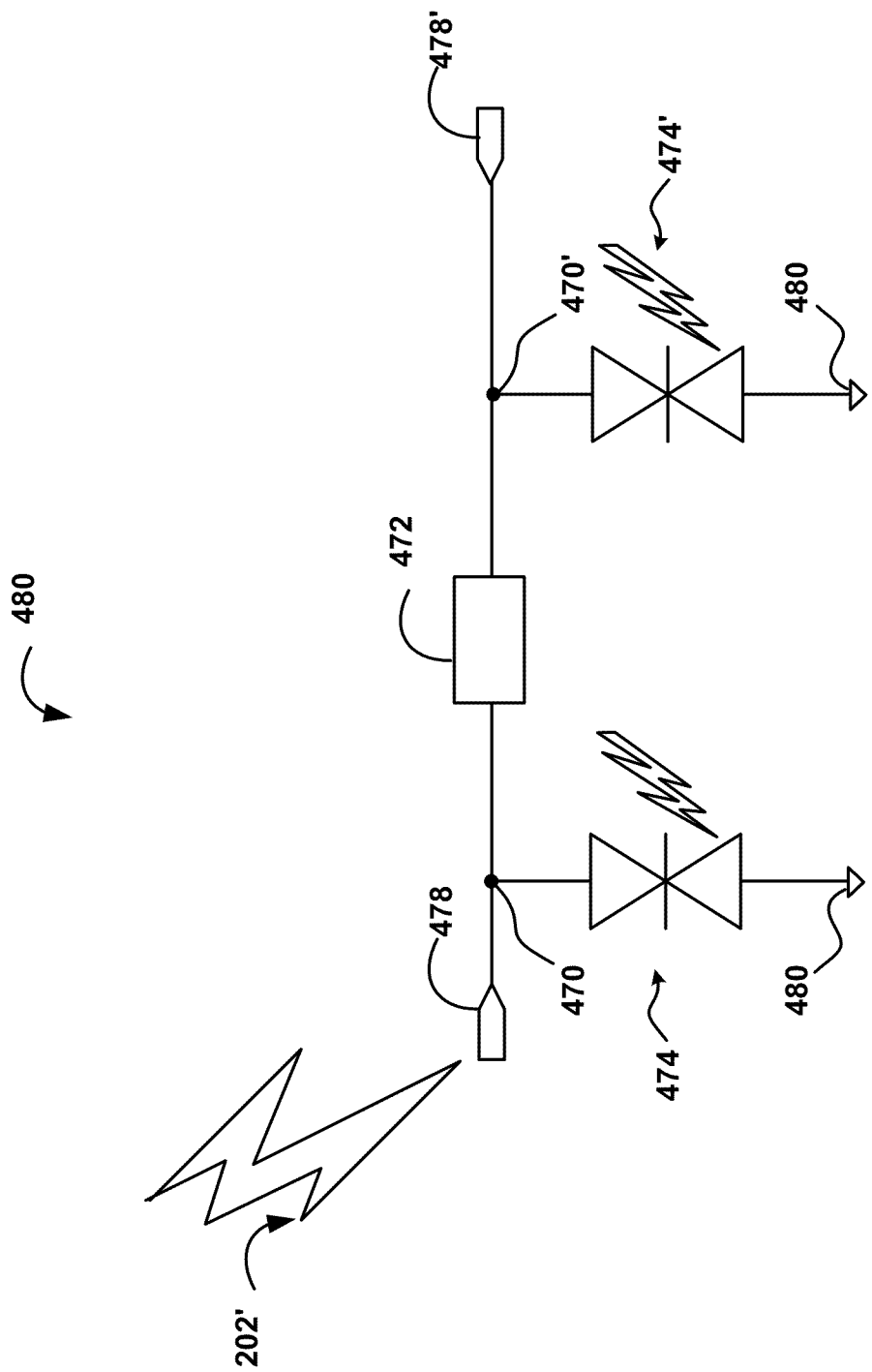
FIG. 4C illustrates an equivalent circuit model for the ferroic VSD material inductor or embedded ferroic VSD material inductor of FIG. 4B, in accordance with an embodiment of the present invention.

FIG. 4B illustrates a structure of a ferroic VSD material inductor or embedded ferroic VSD material inductor 460 in accordance with an embodiment of the present invention. FIG. 4C illustrates an equivalent circuit model for the ferroic VSD material inductor or embedded ferroic VSD material inductor 460 of FIG. 4B in accordance with an embodiment of the present invention. The inductor 460 includes a substrate 402, a ferroic material 410, which may be a ferroic VSD material 410, and a conductive layer 462. The conductive layer 462 includes a first pad 470, a second pad 470', an inductive trace 472, and a conductive plane 464. The inductive trace 472 may be disposed between the first pad 470 and the second pad 470' and configured for electrical communication between the first pad 470 and the second pad 470'. In one embodiment, the inductive trace 472 is a set of conductive structures, with one or more of the conductive structures being embedded at least partially in a VSD material or ferroic VSD material.

The conductive layer 462 from the embodiment of FIG. 4C further includes a switch gap 474 configured to electrically isolate the first pad 470, inductive trace 472, and second pad 470' from the conductive plane 464. The switch gap 474 of FIG. 4B is illustrated as continuous, however, a first switch gap 474 between the first pad 470 and the conductive plane 464 may be considered separately from a second switch gap 474' between the second pad 470' and the conductive plane 464. A via 476 is in electrical communication between a first connector 478 and the first pad 470. Similarly, a second via 476' is in electrical communication between a second connector 478' and the second pad 470'.

The conductive plane 464, first pad 470, inductive trace 472, switch gap 474, and second pad 470' may be fabricated using standard practices understood by persons having ordinary skill in the art. For example, a layer of conductive material such as copper, gold, silver, tin, aluminum or alloys thereof may plated onto the ferroic VSD material 410 to form the conductive layer 462. The switch gap 474 may then be etched or otherwise removed from the conductive layer 462 to form the conductive plane 464, first pad 470, inductive trace 472, switch gap 474, and second pad 470'. Alternatively, these features may be deposited as a metalized pattern on the ferroic VSD material 410. The conductive plane 464 of FIG. 4B is connected to a ground 480. In various embodiments, the ground 480 is a ground, virtual ground, a shield, a safety ground, a package shell, a conductive line, a direct or indirect connection to a component, a point along any other electrical path, or any combination of the foregoing.

The inductor 460 further includes an embedding layer 466. The embedding layer 466 may be disposed on the conductive layer 462 and may be configured to encapsulate the conductive layer 462, first pad 470, first via 476, inductive trace 472, switch gap 474, second pad 470', and/or second via 476'. The embedding layer 466 may be opaque but is shown as transparent (indicated using dotted lines) to show the various structures of the inductor 460 that are within the embedding layer 466. Examples of the embedding layer 466 include PCB material, such as prepreg. The first connector 478 and second connector 478' may be fabricated using various conductive materials and exposed at a surface of the embedding layer 466. Examples of conductive materials include copper, gold, silver, tin, aluminum or alloys thereof.

In one embodiment, the ferroic VSD material inductor 460 shown in FIG. 4B is packaged as a discrete component and may be surface mounted to a PCB. In one embodiment, the ferroic VSD material inductor 460 shown in FIG. 4B is embedded in a substrate (e.g., a PCB or component package) at least partially, in which case the ferroic VSD material inductor 460 becomes an embedded ferroic VSD material inductor.

Replacing a discrete ferroic component, such as the discrete ferroic inductor discussed in connection with FIGS. 1A, 1B, 1C and 1D, with a ferroic VSD material circuit element or embedded ferroic VSD material circuit element in accordance with embodiments of the present invention provides various functional advantages when operated to provide protection against ESD or other overvoltage events. For example, the ferroic VSD material inductor 460 shown in FIG. 4B may perform as an inductor under normal operating conditions, but may also act as an ESD protector in the event that an incoming voltage exceeds the characteristic voltage of the ferroic VSD material.

In one embodiment, upon occurrence of an overvoltage signal 202', such as an ESD pulse, at the first connector 478, the ferroic VSD material 410 in the region of first switch gap 474 between the first pad 470 and the conductive plane 464 may switch to a substantially conductive state. Upon becoming substantially conductive, the ferroic VSD material 410 in the region of first switch gap 474 is configured to shunt at least a portion of the overvoltage signal 202' to the conductive plane 464 and then to the ground 480. By redirecting at least a portion of the overvoltage signal 202' from the first connector 478 to the ground 480, the ferroic VSD material 410 in the region of first switch gap 474 prevents at least a portion of the overvoltage signal 202' from being communicated via the inductive trace 472 to the second pad 470' and through the second via 476' to the second connector 478'. The portion of the overvoltage signal 202' that is transmitted along the inductive trace 472 may be further attenuated by the impedance of the inductive trace 472. Similarly, a portion of the overvoltage signal 202' may be shunted across the second switch gap 474' from the second pad 470' to the conductive plane 464 and to the ground 480.

In one embodiment, in response to a voltage signal across the first connector 478 shown in FIG. 4B (and FIG. 4C) that exceeds the characteristic voltage level of the VSD material 410, the ferroic VSD material 410 becomes substantially conductive and the input inductance of the ferroic VSD material circuit decreases substantially, such that the respective voltage signal is conducted to a ground (e.g., ground 480) or is otherwise prevented in whole or in part from passing through the inductive trace 472 to the second connector 478' shown in FIG. 4B (and FIG. 4C), thus, protecting an electronic component connected to the second connector 478'. In one embodiment, however, the ferroic VSD material 410 underlying, surrounding and/or encapsulating the inductive trace 472 of FIG. 4B also exhibits the operational characteristics of an inductor, and therefore acts as a low-pass filter, thus, selectively blocking higher frequencies. Consequently, because ESD signals tend to include high frequency components, the ferroic VSD material 410 shown in the embodiment of FIG. 4B may be able to both block a high-frequency portion of an ESD signal in cooperation with the inductive trace 472 and divert the signal across the switch gap 474, to prevent the ESD signal in whole or in part from passing through the ferroic VSD material inductor. Because the switching time of the ferroic VSD material 410 comprised in a ferroic VSD material inductor 460 is non-zero, the ability to block the high frequency component of an ESD signal in whole or in part helps further protect electronic components by delaying the propagation and/or decreasing the power of the ESD signal that would otherwise affect the electronic component being protected.

In one embodiment, a ferroic VSD material inductor or an embedded ferroic VSD material inductor, such as the ferroic VSD material inductor 460 shown in FIG. 4B may be deployed to act as circuit element 220 from the embodiment of FIG. 2B.

In accordance with the embodiment of FIG. 4C, an overvoltage signal 202' such as an ESD signal present at the input may be diverted to ground 480 through the first switch gap 474 when the voltage of the input overvoltage signal 202' exceeds the characteristic voltage of the ferroic VSD material 410 in the region of the first switch gap 474. In parallel, the inductive response of the inductive trace 472 would delay and/or block in whole or in part higher frequency components of the overvoltage signal 202', therefore reducing or eliminating the signal that reaches the output at the second connector 478'. If the residual signal that reaches the second connector 478' still exceeds the characteristic voltage of the ferroic VSD material disposed within the second switch gap 474', then the residual signal can be diverted to ground 480 through the second switch gap 474'. As a result, to the extent that any portion of the overvoltage signal 202' propagates through the second connector 478' of the circuit shown in FIG. 4C, that signal would likely be diminished in terms of amplitude and power. Consequently, an electronic component, such as the electronic component 230 from the embodiment of FIG. 2B, that is disposed behind such a ferroic circuit element would be protected against ESD events.

While only one instance of switch gap 474, first pad 470, inductive trace 472, and second pad 470' is illustrated in the conductive plane 462 of FIG. 4B, the conductive plane 462 may include multiple instances of a switch gap 474, first pad 470, inductive trace 472, and second pad 470'. The inductive trace 472 is illustrated in FIG. 4B as a straight line between the first pad 470 and the second pad 470'. However, the inductive trace 472 may be configured in various combinations of lines, angles, shapes and curves. The paths of such lines, angles, shapes and curves are not constrained to a space between the first pad 470 and the second pad 470'. While the feature 472 in FIGS. 4B and 4C is described as an inductive trace, other circuit elements (e.g., capacitive, resistive, active, passive, etc.) may be used as feature 472 in place of or in combination with an inductive trace.

Replacing a discrete ferroic component, such as the discrete ferroic inductor discussed in connection with FIGS. 1A, 1B, 1C and 1D, with an embedded ferroic VSD material circuit element in accordance with embodiments of the present invention provides various advantages, including the following: (a) The embedded ferroic circuit element may be prebuilt into a substrate, such as a PCB, at a time when the substrate is manufactured, thus, avoiding a need to add discrete ferroic components at a later time. (b) Design of ESD protection for a device can be performed at a higher level (e.g., at a system level or PCB level), so that ESD protection can be optimized across multiple components or across an entire system or subsystem. In contrast, using discrete ferroic components often leads to no optimization beyond the specific component or components being protected. (c) The cost of using discrete ferroic components may be avoided or substantially decreased by using embedded ferroic circuit elements that are prebuilt into a substrate.

Figure 5:
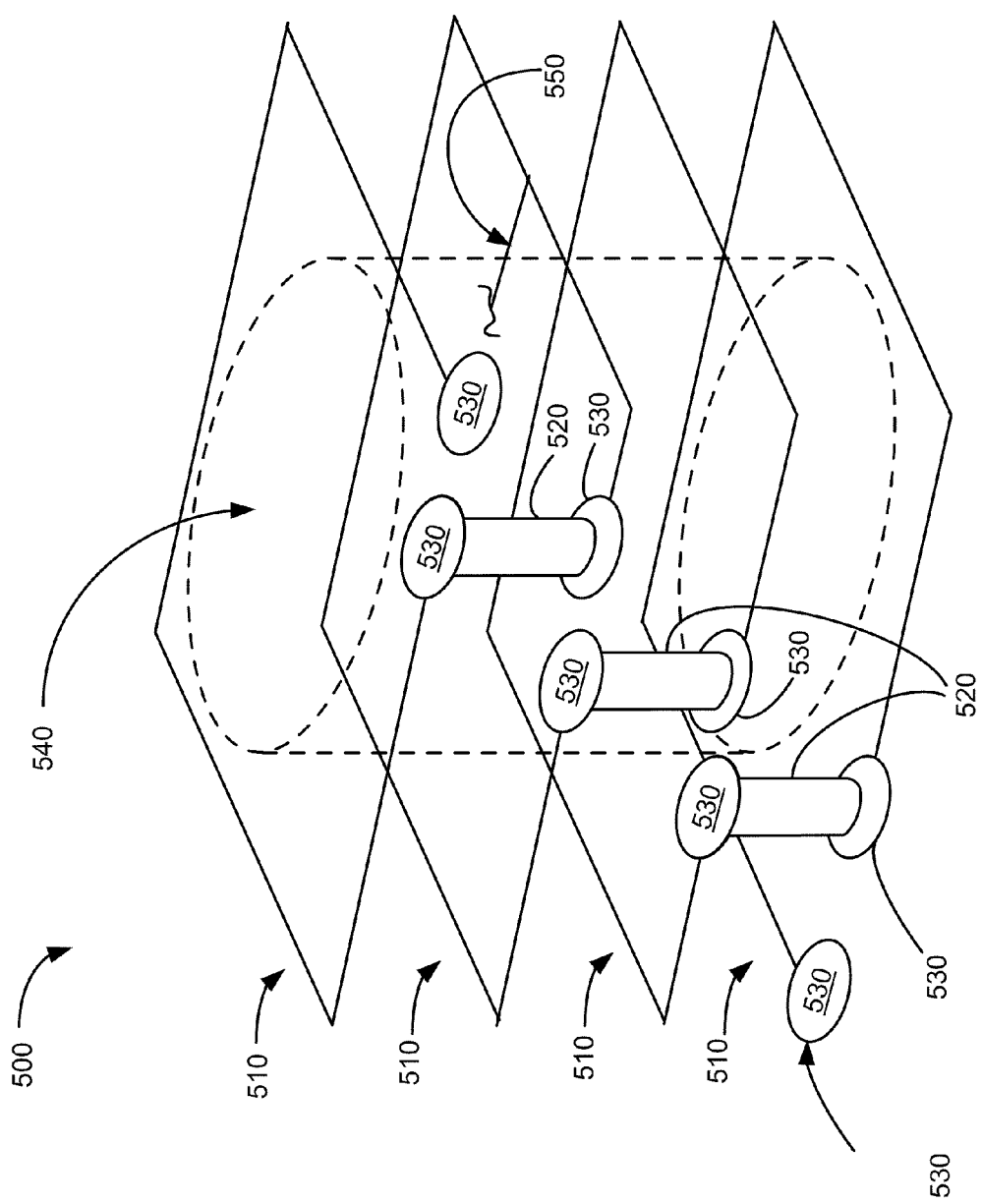
FIG. 5 is a perspective view of a block diagram illustrating a stackup including an embedded inductor, according to some embodiments.

FIG. 5 is a perspective view of a block diagram illustrating a stackup 500 including an embedded inductor, according to some embodiments. Stackup 500 includes a plurality of dielectric layers (not shown in FIG. 5), such as PCB layers. Conductive lines 510 (e.g., on each layer) may be connected by conductive vias 520 to conductive lines 510 in adjacent layers. Vias 520 may land on conductive pads 530 associated with the respective conductive lines 510. One or more vias 540 may be filled with a ferroic VSD material, which may enable the stackup 500 to operate as an embedded inductor. In some cases, an optional shunt connector 550 may connect one or more conductive lines 510 to a filled via 540. In some embodiments, a structure such as stackup 500 may behave as an inductor at a first voltage and as a resistor at a second voltage.

Figure 6:
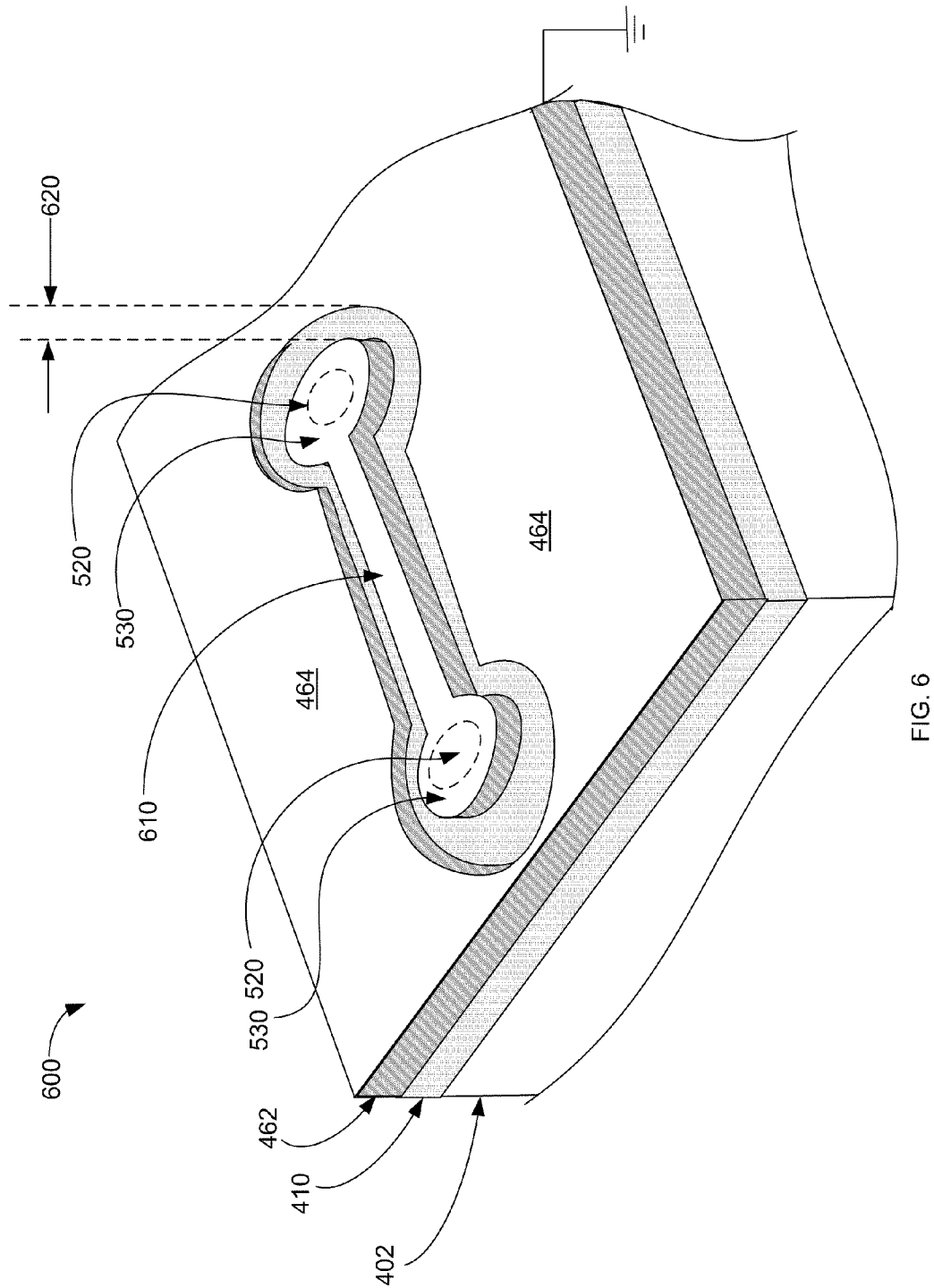
FIG. 6 is a perspective view of a block diagram illustrating an inductor (e.g., an embedded inductor), according to some embodiments.

FIG. 6 is a perspective view of a block diagram illustrating an inductor (e.g., an embedded inductor), according to some embodiments. Device 600 includes a conductive wire forming an inductive trace 610 disposed on a voltage switchable dielectric material 410. In this example, ends of inductive trace 610 terminate in pads 530, which may be connected to vias 520. The vias 520 are illustrated using dotted lines to indicate that they are embedded in one or more of conductive layer 420, VSD material layer 410, and/or substrate layer 402. The conductive layer 462 includes the pads 530, the inductive trace 610, a conductive plane 464 and a switch gap 620. The switch gap 620 is configured to electrically isolate the pads 530 and/or the inductive trace 610 from the conductive plane 464. As discussed elsewhere herein, the conductive layer 462 including the conductive plane 464, pads 530, inductive trace 610 and switch gap 620 may be fabricated using standard techniques known to persons having ordinary skill in the art. VSD material 410 may inductively couple with current passing through inductive trace 610. Inductive coupling may be increased by adding ferroic (e.g., ferromagnetic) materials to VSD material 410 for configuration of the device 600 as a structure of a ferroic VSD material inductor or embedded ferroic VSD material inductor.

Figure 7:
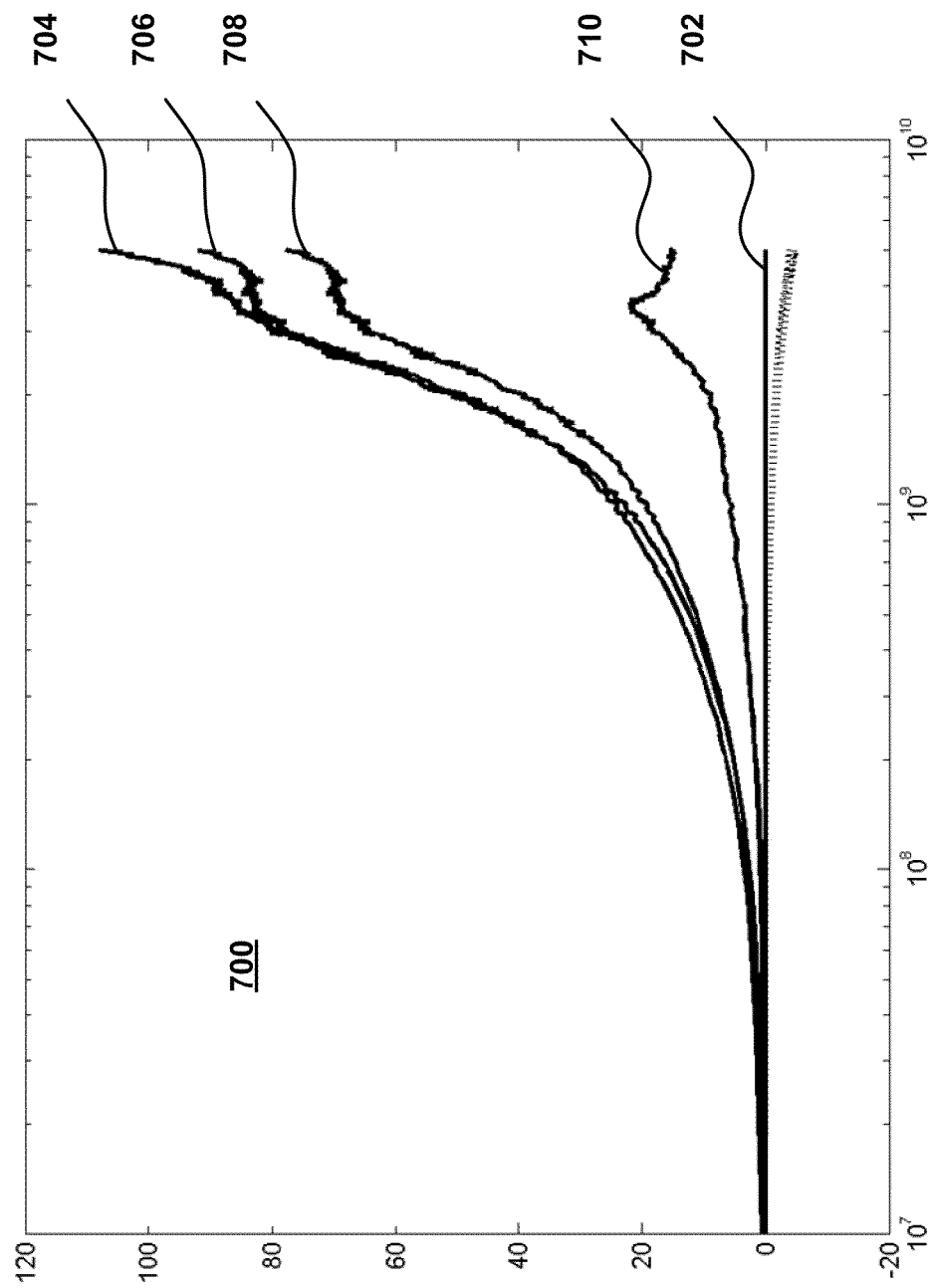
FIG. 7 shows a graph illustrating impedance vs. frequency for various test circuits including induction coils representing examples of ferroic particles or materials that may be introduced in a VSD material composition to produce a ferroic VSD material, in accordance with various embodiments of the invention.
Figure 8:
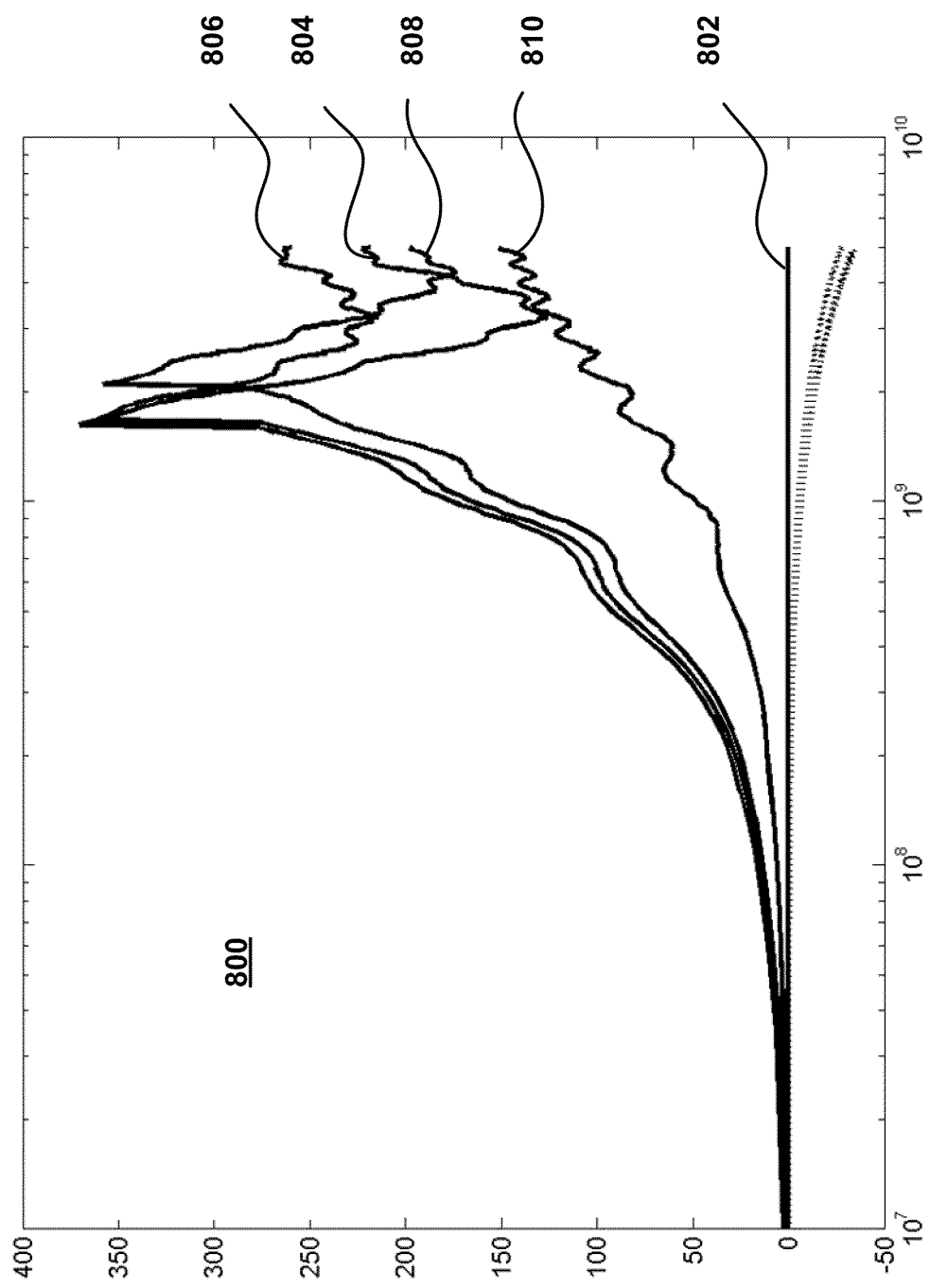
FIG. 8 shows a graph illustrating impedance vs. frequency for various test circuits including induction coils representing examples of ferroic particles or materials that may be introduced in a VSD material composition to produce a ferroic VSD material in accordance with various embodiments of the invention.

FIG. 7 shows a graph 700 illustrating impedance vs. frequency for various test circuits including a set of conductive structures in the form of induction coils embedded in various ferroic VSD material compositions, in accordance with various embodiments of the invention. FIG. 8 shows a graph 800 illustrating impedance vs. frequency for various test circuits including a set of conductive structures in the form of induction coils embedded in various ferroic VSD material compositions, in accordance with various embodiments of the invention. While the materials used for the text examples in FIGS. 7 and 8 are the same, FIG. 7 differs from FIG. 8 in that the induction coils used in test examples illustrated in graph 800 of FIG. 8 are longer than the induction coils used in test examples illustrated in graph 700 of FIG. 7. The coils tested for FIG. 7 were about 25 mm while the coils tested for FIG. 8 were about 150 mm.

The vertical axis of graphs 700 and 800 represents an impedance amplitude that has been calculated based on measurements of S-Parameters. The measurements of the S-Parameters were made on the test coils while applying input signals at various frequencies. The horizontal axis represents the frequency of the input signals in hertz. Curves labeled 702-710 are impedance amplitudes for various ferroic materials as described below. Unlabeled dotted line curves represent phase information corresponding to the respective amplitude curves (of the same color). Conversion between measured S-Parameters and impedance figures may be achieved using formulas known in the prior art, with various formulas providing different levels of accuracy depending on applicable assumptions, approximations and other factors. The values on the vertical axis in graphs 700 and 800 correspond to Ohms, a measure of impedance.

Figure 1E:
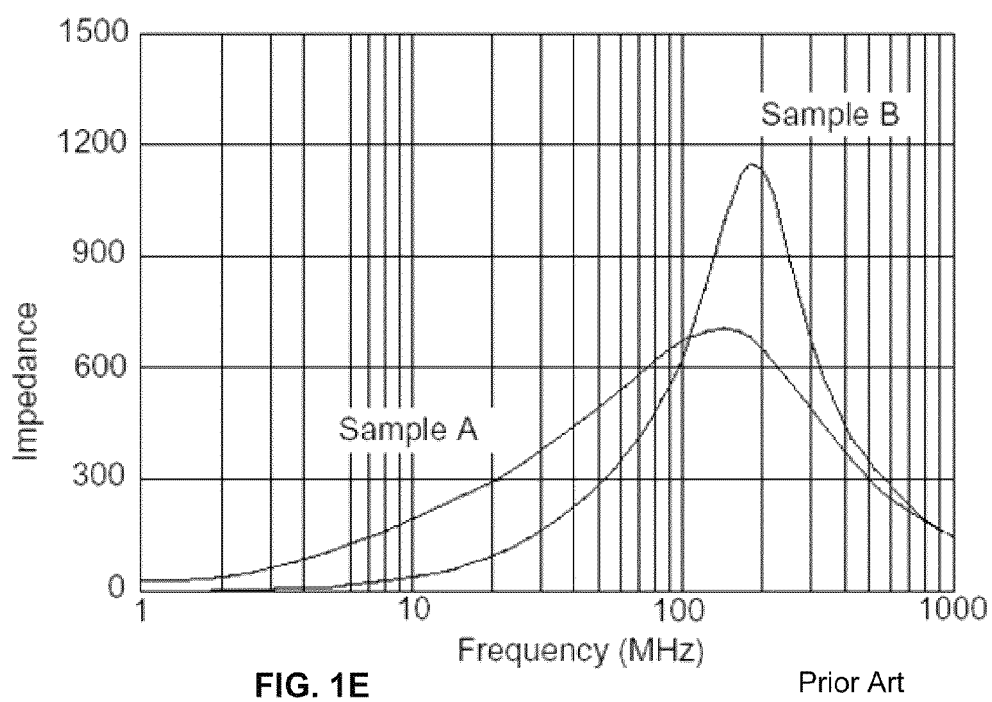
FIG. 1E illustrates a plot of a transfer curve for a prior art ferrite bead inductor, such as illustrated in FIG. 1A.

It may be appreciated upon initial inspection that in general, the amplitude of the impedance for the longer coils represented in graph 800 is greater than the amplitude of the impedance for the shorter coils of graph 700. It may be further appreciated that the longer coils represented in the graph 800 exhibit a given impedance response at lower frequencies than the shorter coils represented in the graph 700. In various embodiments, the curves 704-708 represent an improvement in performance of embedded ferroic VSD material inductors over the response for prior art discrete bead inductors illustrated in prior art FIG. 1E.

Various ferroic materials under test for graphs 700 and 800 include barium titanate, bismuth ferrite, colemanite, other ferrites (e.g., $Fe_2O_3$), ferroelectric polymers, germanium telluride, lead scandium tantalite, lead zirconate titanate, lithium niobate, polyvinylidene fluoride, potassium sodium tartrate, potassium titanyl phosphate, and other materials that have ferroic properties and are otherwise compatible with the respective VSD material compositions. Curves 702 in graphs 700 and 800 represent a conductive trace disposed on a substrate such as prepreg without background inductance, ferric material, or VSD material. Curve 702 may be considered to represent a control condition.

Curves 710 in graphs 700 and 800 represent an example of a base test coil including a trace forming an inductor coil that is embedded in a general layer comprising a ferroic VSD material. The layer of ferroic VSD material includes a combination of the following type of ferroic particles: Iron Oxide ($Fe_3O_4$) in the form of 20-30 nm APS Powder available from Alfa Aesar in a volume proportion of approximately 30%. This base test coil provides a background for the test coils represented by curves 704, 706 and 708. Additional ferroic VSD material as described below is built on top of the base test coil to prepare the test coils represented by curves 704, 706 and 708.

Curves 708 in graphs 700 and 800 represent an example of a test coil embedded in a ferroic VSD material that includes a combination of the following three types of ferroic particles: Iron Oxide ($Fe_3O_4$) in the form of 20-30 nm APS Powder available from Alfa Aesar in a volume proportion of approximately 9%, 4SP-10 Nickel Powder available from Novamet Specialty Products in a volume proportion of approximately 13%, and NFP401S Nickel Powder available from JFE Mineral Company, LTD in a volume proportion of approximately 6%.

Curves 704 in graphs 700 and 800 represent an example of a test coil embedded in a ferroic VSD material that includes a combination of the following two types of ferroic particles: 4SP-10 Nickel Powder available from Novamet Specialty Products in a volume proportion of approximately 20%, and NFP401S Nickel Powder available from JFE Mineral Company, LTD in a volume proportion of approximately 8%.

Curves 706 in graphs 700 and 800 represent an example of a test coil embedded in a ferroic VSD material that includes a combination of the following three types of ferroic particles: Iron Oxide ($Fe_3O_4$) in the form of 20-30 nm APS Powder available from Alfa Aesar in a volume proportion of approximately 7%, 4SP-10 Nickel Powder available from Novamet Specialty Products in a volume proportion of approximately 20%, and NFP401S Nickel Powder available from JFE Mineral Company, LTD in a volume proportion of approximately 8%.

Some embodiments include a computer readable storage medium coupled to a processor and memory. Executable instructions stored on the computer readable storage medium may be executed by the processor to perform various methods described herein. Sensors and actuators may be coupled to the processor, providing input and receiving instructions associated with various methods.

Some embodiments include sensors to sense various parameters (e.g., current, voltage, power, distance, resistance, resistivity, inductance, capacitance, thickness, strain, temperature, stress, viscosity, concentration, depth, length, width, switching voltage and/or voltage density (between insulating and conducting), trigger voltage, clamp voltage, off-state current passage, dielectric constant, time, date, and other characteristics). Various apparatus may monitor various sensors, and systems may be actuated by automated controls (solenoid, pneumatic, piezoelectric, and the like). Certain instructions provide for closed-loop control of various parameters via coupled sensors providing input and coupled actuators receiving instructions to adjust parameters. Certain embodiments include materials. Various embodiments include telephones (e.g., cell phones), USB-devices (e.g., a USB-storage device), personal digital assistants, laptop computers, netbook computers, tablet PC computers and the like.

As used in this patent, a set means any group of one, two or more items. Analogously, a subset means, with respect to a set of N items, any group of such items consisting of N−1 or less of the respective items.

As used in this specification, the terms "include," "including," "for example," "exemplary," "e.g.," and variations thereof, are not intended to be terms of limitation, but rather are intended to be followed by the words "without limitation" or by words with a similar meaning. Definitions in this specification, and all headers, titles and subtitles, are intended to be descriptive and illustrative with the goal of facilitating comprehension, but are not intended to be limiting with respect to the scope of the inventions as recited in the claims. Each such definition is intended to also capture additional equivalent items, technologies or terms that would be known or would become known to a person of average skill in this art as equivalent or otherwise interchangeable with the respective item, technology or term so defined. Unless otherwise required by the context, the verb "may" indicates a possibility that the respective action, step or implementation may be performed or achieved, but is not intended to establish a requirement that such action, step or implementation must be performed or must occur, or that the respective action, step or implementation must be performed or achieved in the exact manner described.

The above description is illustrative and not restrictive. This patent describes in detail various embodiments and implementations of the present invention, and the present invention is open to additional embodiments and implementations, further modifications, and alternative constructions. There is no intention in this patent to limit the invention to the particular embodiments and implementations disclosed; on the contrary, this patent is intended to cover all modifications, equivalents and alternative embodiments and implementations that fall within the scope of the claims. The scope of the invention should, therefore, be determined not with reference to the above description, but instead should be determined with reference to the appended claims along with their full scope of equivalents.

What is claimed is:

1. A ferroic circuit element comprising:
    a layer of ferroic voltage switched dielectric (VSD) material, the ferroic VSD material to exhibit nonlinear resistance as a function of voltage;
    a first conductive structure and a second conductive structure, the first and second conductive structures positioned directly on top of the layer of ferroic VSD material such that bottom portions of the first and second conductive structures are at least partially embedded within the layer of ferroic VSD material, the first and second conductive structures arranged in a horizontal plane that is parallel to the layer of ferroic VSD material, the first and second conductive structures separated by a first horizontal gap;
    a substrate; and
    a conductive plane in contact with the layer of ferroic VSD material,
    wherein the first and second conductive structures and the ferroic VSD material cause the ferroic circuit element to exhibit a frequency-dependent impedance;
    wherein the ferroic VSD material, the first and second conductive structures, and the conductive plane are at least partially disposed within the substrate, wherein the conductive plane is disposed between the layer of ferroic VSD material and the substrate, and wherein each of the first and second conductive structures form a capacitor comprising two or more layers of conductors and ferroic VSD material interspersed between each of the conductors, wherein each of the two or more layers of conductors are substantially parallel and substantially overlay one another.

2. The ferroic circuit element of claim 1, wherein the first and second conductive structures comprise at least two plates, and the ferroic circuit element exhibits a capacitive characteristic.

3. The ferroic circuit element of claim 1, wherein the substrate is a PCB or the package of an electronic component.

4. The ferroic circuit element of claim 1, wherein the ferroic circuit element protects an electronic component against an ESD event.

5. The ferroic circuit element of claim 4, wherein the ferroic circuit and the electronic component are disposed within a mobile phone, electronic tablet, electronic reader, mobile computer, desktop computer, server computer, television set, music player, personal health management device, light emitting diode (LED), or device comprising an LED.

6. An electronic device comprising a ferroic circuit element, the ferroic circuit element comprising:
a layer of ferroic voltage switched dielectric (VSD) material, the ferroic VSD material to exhibit nonlinear resistance as a function of voltage;
a first conductive structure and a second conductive structure, the first and second conductive structures positioned directly on top of the layer of ferroic VSD material such that bottom portions of the first and second conductive structures are at least partially embedded within the layer of ferroic VSD material, the first and second conductive structures arranged in a horizontal plane that is parallel to the layer of ferroic VSD material, the first and second conductive structures separated by a first horizontal gap;
a substrate; and
a conductive plane in contact with the layer of ferroic VSD material,
wherein the first and second conductive structures and the ferroic VSD material cause the ferroic circuit element to exhibit a frequency-dependent impedance,
wherein the ferroic VSD material, the first and second conductive structures, and the conductive plane are at least partially disposed within the substrate, wherein the conductive plane is disposed between the layer of ferroic VSD material and the substrate, and
wherein each of the first and second conductive structures form a capacitor comprising two or more layers of conductors and ferroic VSD material interspersed between each of the conductors, wherein each of the two or more layers of conductors are substantially parallel and substantially overlay one another.

7. The electronic device of claim 6, wherein the first and second conductive structures includes at least two capacitor plates.

8. The electronic device of claim 6, wherein the first and second conductive structures includes an active device.

9. The electronic device of claim 6, wherein the electronic device is a mobile phone, electronic tablet, electronic reader, mobile computer, desktop computer, server computer, television set, music player, personal health management device, light emitting diode (LED), or device comprising an LED.

10. A ferroic circuit element comprising:
a ferroic medium layer, the ferroic medium layer to exhibit nonlinear resistance as a function of voltage;
a first conductive structure and a second conductive structure, the first and second conductive structures positioned directly on top of the ferroic medium layer such that bottom portions of the first and second conductive structures are at least partially embedded within the ferroic medium layer, the first and second conductive structures arranged in a horizontal plane that is parallel to the ferroic medium layer, the first and second conductive structures separated by a first horizontal gap;
a substrate; and
a conductive plane in contact with the ferroic medium layer,
wherein the ferroic medium layer, the first and second conductive structures, and the conductive plane are at least partially embedded within the substrate,
wherein the conductive plane is disposed between the ferroic medium layer and the substrate, and
wherein each of the first and second conductive structures form a capacitor comprising two or more layers of conductors and ferroic VSD material interspersed between each of the conductors, wherein each of the two or more layers of conductors are substantially parallel and substantially overlay one another.

11. The ferroic circuit element of claim 10, wherein the first and second conductive structures set of conductive structures comprise at least two plates, and the ferroic circuit element exhibits a capacitive characteristic.

12. The ferroic circuit element of claim 10, wherein the substrate is a PCB or the package of an electronic component.

13. The ferroic circuit element of claim 10, wherein the ferroic circuit element protects an electronic component against an ESD event.

14. The ferroic circuit element of claim 13, wherein the ferroic circuit element and the electronic component are disposed within a mobile phone, electronic tablet, electronic reader, mobile computer, desktop computer, server computer, television set, music player, video display, personal health management device, light emitting diode (LED), or device comprising an LED.

15. The ferroic circuit element of claim 10, wherein the first and second conductive structures extend horizontally in a plane parallel with the planes of the ferroic medium layer and the conductive plane.

16. The ferroic circuit element of claim 11, wherein the first and second conductive structures extend horizontally in a plane parallel with the planes of the ferroic medium layer and the conductive plane.

* * * * *